(12) United States Patent
Li

(10) Patent No.: US 11,854,653 B2
(45) Date of Patent: Dec. 26, 2023

(54) SIGNAL MASKING CIRCUIT AND SEMICONDUCTOR MEMORY

(71) Applicant: CHANGXIN MEMORY TECHNOLOGIES, INC., Hefei (CN)

(72) Inventor: Siman Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/659,325

(22) Filed: Apr. 14, 2022

(65) Prior Publication Data

US 2023/0081627 A1 Mar. 16, 2023

Related U.S. Application Data

(63) Continuation of application No. PCT/CN2021/131852, filed on Nov. 19, 2021.

(30) Foreign Application Priority Data

Sep. 10, 2021 (CN) .......................... 202111064019.9

(51) Int. Cl.
 *G11C 7/10* (2006.01)
 *H03K 19/20* (2006.01)
(52) U.S. Cl.
 CPC ............ *G11C 7/1009* (2013.01); *G11C 7/109* (2013.01); *G11C 7/1039* (2013.01);
 (Continued)
(58) Field of Classification Search
 CPC ... G11C 7/1009; G11C 7/1039; G11C 7/1063; G11C 7/1066; G11C 7/109; G11C 7/1093
 See application file for complete search history.

(56) References Cited

U.S. PATENT DOCUMENTS 5,206,830 A * 4/1993 Isobe ................ G11C 11/40615
 365/194
5,926,435 A 7/1999 Park
 (Continued)

FOREIGN PATENT DOCUMENTS

CN 1384506 A 12/2002
CN 111223504 A 6/2020
 (Continued)

OTHER PUBLICATIONS

First Office Action of the Taiwanese application No. 111120603, dated Nov. 23, 2022.
 (Continued)

*Primary Examiner* — Vanthu T Nguyen
(74) *Attorney, Agent, or Firm* — SYNCODA LLC; Feng Ma

(57) ABSTRACT

A signal masking circuit includes a receiving circuit, a delay control circuit, and a logical operation circuit. The receiving circuit is configured to: receive a signal to be processed and a chip select (CS) signal, and output an initial processing signal and an initial CS signal. The delay control circuit is configured to perform delay and logical control operations on the initial CS signal to obtain a CS masking signal, where a pulse width of the CS masking signal is greater than or equal to two preset clock periods. The logical operation circuit is configured to perform invalid masking on the initial processing signal according to the CS masking signal to obtain a target signal.

17 Claims, 14 Drawing Sheets

(52) U.S. Cl.
CPC .......... *G11C 7/1063* (2013.01); *G11C 7/1066* (2013.01); *G11C 7/1093* (2013.01); *H03K 19/20* (2013.01)

(56) References Cited

U.S. PATENT DOCUMENTS

| | | | |
|---|---|---|---|
| 6,016,070 A * | 1/2000 | Uehara | H03K 5/06 |
| | | | 327/552 |
| 6,188,641 B1 | 2/2001 | Uchida | |
| 6,256,260 B1 | 7/2001 | Shim | |
| 6,505,265 B1 | 1/2003 | Ishikawa | |
| 10,162,406 B1 | 12/2018 | Mazumder | |
| 10,254,782 B2 * | 4/2019 | He | G11C 7/222 |
| 10,354,704 B2 * | 7/2019 | Jung | G11C 5/04 |
| 10,403,335 B1 | 9/2019 | Uemura | |
| 10,475,488 B1 | 11/2019 | Smith | |
| 10,872,643 B2 * | 12/2020 | Uemura | G11C 7/109 |
| 2002/0191466 A1 | 12/2002 | Hwang | |
| 2003/0206427 A1 | 11/2003 | Hwang | |
| 2005/0041506 A1 | 2/2005 | Hwang | |
| 2006/0195628 A1 | 8/2006 | Hori | |
| 2019/0101975 A1 | 4/2019 | Mazumder | |
| 2019/0348088 A1 | 11/2019 | Smith et al. | |
| 2019/0371374 A1 | 12/2019 | Uemura et al. | |
| 2020/0081520 A1 | 3/2020 | Mazumder | |
| 2020/0167298 A1 | 5/2020 | Yang et al. | |

FOREIGN PATENT DOCUMENTS

| | | |
|---|---|---|
| WO | 2019045796 A1 | 3/2019 |
| WO | 2019236155 A1 | 12/2019 |

OTHER PUBLICATIONS

Supplementary European Search Report in the European application No. 21918121.1, dated Jul. 18, 2023, 8 pages.

* cited by examiner

SIGNAL MASKING CIRCUIT AND SEMICONDUCTOR MEMORY

CROSS-REFERENCE TO RELATED APPLICATIONS

This is a continuation of International Patent Application No. PCT/CN2021/131852 filed on Nov. 19, 2021, which claims priority to Chinese Patent Application No. 202111064019.9 filed on Sep. 10, 2021. The disclosures of these applications are hereby incorporated by reference in their entirety.

BACKGROUND

With the continuous development of semiconductor technologies, increasing demands are being placed on the speed of data transmission in the manufacture and use of devices such as computers. To obtain a faster speed of data transmission, a series of memories and other devices that can transmit data at a Double Data Rate (DDR) have emerged.

In a Dynamic Random Access Memory (DRAM), invalid signal masking on a command/address (CA) signal or a clock signal may be implemented through a chip select (CS) signal, thereby reducing current consumption.

SUMMARY

The disclosure relates to the field of integrated circuit technologies, and in particular, to a signal masking circuit and a semiconductor memory.

The disclosure provides a signal masking circuit and a semiconductor memory, which can minimize a current waste to reduce power consumption while ensuring that a DRAM does not lose valid information.

According to a first aspect, embodiments of the disclosure provide a signal masking circuit, including a receiving circuit, a delay control circuit, and a logical operation circuit.

The receiving circuit is configured to receive a signal to be processed and a CS signal, and output an initial processing signal and an initial CS signal.

The delay control circuit is configured to perform delay and logical control operations on the initial CS signal to obtain a CS masking signal. A pulse width of the CS masking signal is greater than or equal to two preset clock periods.

The logical operation circuit is configured to perform invalid masking on the initial processing signal according to the CS masking signal to obtain a target signal.

In some embodiments, the CS signal may be a signal indicating whether a chip is selected and be an active-low pulse signal, and a pulse width of the CS signal may be one preset clock period.

In some embodiments, the logical operation circuit may be configured to mask, when the initial processing signal is a signal corresponding to a target chip, an invalid signal in the initial processing signal according to the CS masking signal, and/or mask, when the initial processing signal is a signal corresponding to a non-target chip, the initial processing signal completely according to the CS masking signal.

The target chip is a chip selected by the CS signal, and the non-target chip is a chip that is not selected by the CS signal.

In some embodiments, the signal to be processed may include at least one of a CA signal or a clock signal. A period of the clock signal is equal to the preset clock period.

In some embodiments, when the signal to be processed is the CA signal, the receiving circuit may include a first receiving module and a second receiving module, and the logical operation circuit may include a first logical operation circuit.

The first receiving module may be configured to receive the CA signal and output an initial CA signal.

The second receiving module may be configured to receive the CS signal and output the initial CS signal.

The delay control circuit may be connected to an output terminal of the second receiving module, and may be configured to perform the delay and logical control operations on the initial CS signal to obtain the CS masking signal.

The first logical operation circuit may be connected to an output terminal of the delay control circuit and an output terminal of the first receiving module, and may be configured to perform a logical operation on the CS masking signal and the initial CA signal to obtain a target CA signal.

In some embodiments, when the signal to be processed is the clock signal, the receiving circuit may include a third receiving module and a fourth receiving module, and the logical operation circuit may include a second logical operation circuit.

The third receiving module may be configured to receive the clock signal and output an initial clock signal.

The fourth receiving module may be configured to receive the CS signal and output the initial CS signal.

The delay control circuit may be connected to an output terminal of the fourth receiving module, and may be configured to perform the delay and logical control operations on the initial CS signal to obtain the CS masking signal.

The second logical operation circuit may be connected to an output terminal of the delay control circuit and an output terminal of the third receiving module, and may be configured to perform a logical operation on the CS masking signal and the initial clock signal to obtain a target clock signal.

In some embodiments, when the signal to be processed is the CA signal and the clock signal, the receiving circuit may include a first receiving module, a second receiving module, and a third receiving module, and the logical operation circuit may include a first logical operation circuit and a second logical operation circuit.

The first receiving module may be configured to receive the CA signal and output an initial CA signal.

The second receiving module may be configured to receive the CS signal and output the initial CS signal.

The third receiving module may be configured to receive the clock signal and output an initial clock signal.

The delay control circuit may be connected to an output terminal of the second receiving module, and may be configured to perform the delay and logical control operations on the initial CS signal to obtain the CS masking signal.

The first logical operation circuit may be connected to an output terminal of the delay control circuit and an output terminal of the first receiving module, and may be configured to perform invalid masking on the initial CA signal according to the CS masking signal to obtain a target CA signal.

The second logical operation circuit may be connected to an output terminal of the delay control circuit and an output terminal of the third receiving module, and may be configured to perform a logical operation on the CS masking signal and the initial clock signal to obtain a target clock signal.

In some embodiments, the first logical operation circuit may include a first buffer, a first AND gate, and a second buffer.

The first buffer may be connected to the first receiving module, and may be configured to perform driving enhancement and delay processing on the initial CA signal to obtain a first CA signal.

The first AND gate may be connected to an output terminal of the first buffer and the output terminal of the delay control circuit, and may be configured to perform an AND operation on the CS masking signal and the first CA signal to obtain a second CA signal.

The second buffer may be connected to an output terminal of the first AND gate, and may be configured to perform driving enhancement and delay processing on the second CA signal to obtain the target CA signal.

In some embodiments, the second logical operation circuit may include a third buffer, a second AND gate, and a fourth buffer.

The third buffer may be connected to the third receiving module, and may be configured to perform driving enhancement and delay processing on the initial clock signal to obtain a first clock signal.

The second AND gate may be connected to an output terminal of the third buffer and the output terminal of the delay control circuit, and may be configured to perform an AND operation on the CS masking signal and the first clock signal to obtain a second clock signal.

The fourth buffer may be connected to an output terminal of the second AND gate, and may be configured to perform driving enhancement and delay processing on the second clock signal to obtain the target clock signal.

In some embodiments, the delay control circuit may include a delay module, a pulse width adjustment module, a first inverter, and a first OR gate.

The first inverter may be configured to invert the initial CS signal to obtain a first intermediate signal.

The delay module may be configured to delay the initial CS signal to obtain a second intermediate signal.

The pulse width adjustment module may be configured to perform pulse width extension on the second intermediate signal to obtain a third intermediate signal.

The first OR gate may be connected to an output terminal of the first inverter and an output terminal of the pulse width adjustment module, and may be configured to perform an OR operation on the first intermediate signal and the third intermediate signal to obtain the CS masking signal.

In some embodiments, the delay module may include a first delay unit, a second delay unit, and a second inverter, and the second inverter is located between the first delay unit and the second delay unit.

The first delay unit may be configured to perform a first delay processing on the initial CS signal to obtain a first delay signal.

The second inverter may be configured to invert the first delay signal to obtain an inverted delay signal.

The second delay unit may be configured to perform a second delay processing on the inverted delay signal to obtain the second intermediate signal.

In some embodiments, each of the first delay unit and the second delay unit may be formed by a resistor R and a capacitor C.

In some embodiments, the pulse width adjustment module may include a fifth buffer and a second OR gate.

The fifth buffer may be connected to an output terminal of the delay module, and may be configured to perform driving enhancement and delay processing on the second intermediate signal to obtain a fourth intermediate signal.

The second OR gate may be connected to the output terminal of the delay module and an output terminal of the fifth buffer, and may be configured to perform an OR operation on the second intermediate signal and the fourth intermediate signal to obtain the third intermediate signal.

In some embodiments, the signal masking circuit may further include a buffer module, and the buffer module may be formed by a plurality of sixth buffers.

The buffer module may be configured to perform driving enhancement and delay processing on the initial CS signal according to the plurality of sixth buffers to obtain a target CS signal.

In some embodiments, the signal masking circuit may further include a sampling circuit and a decoding circuit.

The sampling circuit may be configured to receive the target CA signal, the target clock signal, and the target CS signal, and sample the target CA signal and the target CS signal by using the target clock signal to obtain a sampled CA signal and a sampled CS signal.

The decoding circuit may be connected to an output terminal of the sampling circuit, and may decode the sampled CS signal and the sampled CA signal to obtain a target command result.

In some embodiments, the sampling circuit may be formed by a plurality of D flip-flops (DFFs).

In some embodiments, the buffer may be formed by two inverters.

In some embodiments, a rising edge time of the CS masking signal may be earlier than a pulse start time of the first CA signal, a falling edge time of the CS masking signal may be later than a pulse end time of the first CA signal, and the CS masking signal and the first CA signal may correspond to a same valid pulse of the CS signal.

According to a second aspect, the embodiments of the disclosure provide a semiconductor memory, including the signal masking circuit described in an embodiment of the first aspect.

In some embodiments, the semiconductor memory may be a DRAM chip.

In some embodiments, the DRAM chip meets a 5th Double Data Rate (DDR5) memory specification.

The embodiments of the disclosure provide a signal masking circuit and a semiconductor memory. The signal masking circuit includes a receiving circuit, a delay control circuit, and a logical operation circuit. The receiving circuit is configured to receive a signal to be processed and a CS signal, and output an initial processing signal and an initial CS signal. The delay control circuit is configured to perform delay and logical control operations on the initial CS signal to obtain a CS masking signal. A pulse width of the CS masking signal is greater than or equal to two preset clock periods. The logical operation circuit is configured to perform invalid masking on the initial processing signal according to the CS masking signal to obtain a target signal. In this way, because a CA signal in a DDR5 DRAM is a signal based on two preset clock periods and a pulse width of the CS masking signal provided in the disclosure is greater than or equal to two preset clock periods, during masking of an initial processing signal, a current waste can be minimized to reduce power consumption while ensuring that the DDR5 DRAM does not lose valid information.

DETAILED DESCRIPTION

The technical solutions in the embodiments of the disclosure will be clearly and completely described below with reference to the accompanying drawings in the embodiments of the disclosure. It may be understood that the specific embodiments described herein are only used to explain the related application but are not used to limit the disclosure. In addition, it further needs to be noted that for ease of description, only parts related to the disclosure are illustrated in the accompanying drawings.

Unless otherwise defined, all technological and scientific terms used in the disclosure have meanings the same as those usually understood by those skilled in the art of the disclosure. Terms used in the disclosure are only adopted to describe the embodiments of the disclosure and not intended to limit the disclosure.

"Some embodiments" involved in the following descriptions describes a subset of all possible embodiments. However, it is to be understood that "some embodiments" may be the same subset or different subsets of all the possible embodiments, and may be combined without conflicts.

Term "first/second/third" involved in the following descriptions is only for distinguishing similar objects, and does not represent a specific sequence of the objects. It is to be understood that "first/second/third" may be interchanged to specific sequences or orders if allowed to implement the embodiments of the disclosure described herein in sequences except the illustrated or described ones.

Before the embodiments of the disclosure are further described in detail, nouns and terms involved in the embodiments of the disclosure will be described. The nouns and terms involved in the embodiments of the disclosure are suitable for the following explanations.

Dynamic Random Access Memory (DRAM)

Synchronous Dynamic Random Access Memory (SDRAM)

Double Data Rate (DDR)

$4^{th}$ DDR (DDR4)

$5^{th}$ DDR (DDR5)

Central Processing Unit (CPU)

Command/Address Input (CA)

Clock Input (CLK)

Chip Select Input (CS)

Unbuffered Dual In-Line Memory Modules or unregistered Dual In-Line

Memory Modules (UDIMM)

Small Outline Dual In-line Memory Module (SODIMM)

Valid

Invalid

Power Consumption

Buffer/Repeater (RPT)

Figure 1:
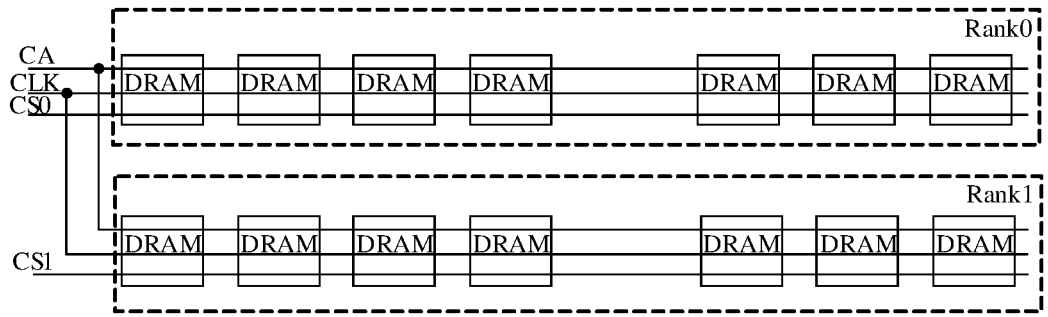
FIG. 1 is a schematic diagram of an application scenario of a DRAM.

FIG. 1 is a schematic diagram of an application scenario of a DRAM. As illustrated in FIG. 1, an application scenario of a UDIMM/SODIMM is used as an example. In a UDIMM/SODIMM system, DRAMs in a rank of a memory bank are connected to a same CS, CAs/CLKs of DRAMs in all ranks are all connected together, and different CS signals are connected to different ranks. For example, as illustrated in FIG. 1, CS0 is connected to Rank0, CS1 is connected to Rank1, and CAs/CLKs of all DRAMs in Rank0 and Rank1 are all connected together.

That is, when a CPU sends a CS0 valid command, DRAMs in all ranks all receive a CA command and a CLK command, and a difference lies in different CSs. A CS may be understood as rank select in a sense. That is, a CS may be considered as a signal representing whether a chip is selected.

It is to be understood that for a DDR4 DRAM, a CS is a command based on one clock period. At present, CS_n may be used to reduce current consumption in two manners: (1) CS_n is used to perform masking on a CA signal; and (2) CS_n is used to perform masking on a clock signal. The CA signal may be denoted by CMD/ADD or may be denoted by CA. The clock signal may be denoted by CLK. It is to be noted that the CMD/ADD is a general name of various CA signals of a DRAM, and may include command signals such as a row address strobe (RAS) pulse, a column address strobe (CAS) pulse, a write (WE) command, a read (RD) command, and may further include address signals A13 to A0 or the like. In addition, during actual application, the CA signal includes several bits of address signals, and may specifically be determined according to specifications of a DRAM. This is not limited in the embodiments of the disclosure.

Figure 2:
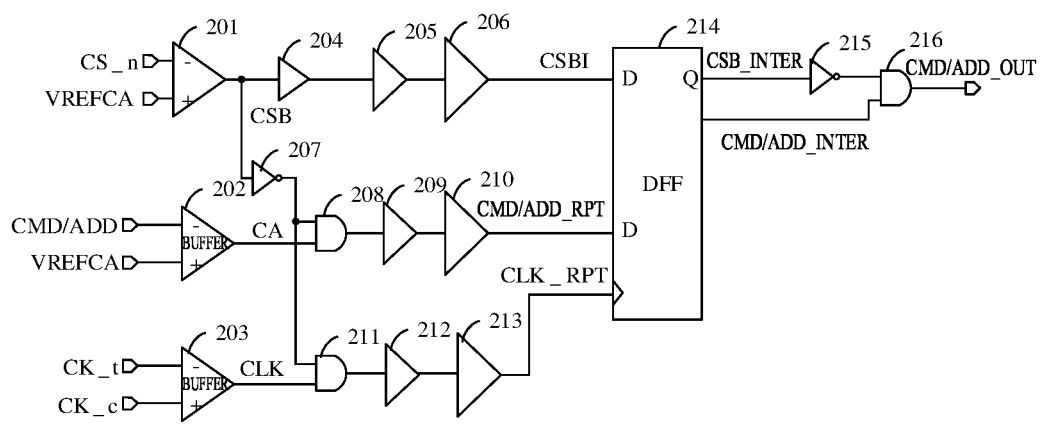
FIG. 2 is a schematic structural diagram of a signal masking circuit.

Specifically, FIG. 2 is a schematic structural diagram of a signal masking circuit. As illustrated in FIG. 2, the signal masking circuit 20 may include a first receiver 201, a second receiver 202, a third receiver 203, a first buffer 204, a second buffer 205, a third buffer 206, a first inverter 207, a first AND gate 208, a fourth buffer 209, a fifth buffer 210, a second AND gate 211, a sixth buffer 212, a seventh buffer 213, a D flip-flop (Data Flip-Flop or Delay Flip-Flop, DFF) 214, a second inverter 215, and a third AND gate 216. Two input signals of the first receiver 201 are a CS signal (denoted by CS_n) and a reference signal (denoted by VREFCA), and an output signal is an initial CS signal (denoted by CSB). Two input signals of the second receiver 202 are a CA signal (denoted by CMD/ADD) and a reference signal (denoted by VREFCA), and an output signal is an initial CA signal (denoted by CA). Two input signals of the third receiver 203 are an input clock signal (denoted by CK_t) and a complementary input clock signal (denoted by CK_c), and an output signal is an initial clock signal (denoted by CLK).

In FIG. 2, driving capabilities of the first buffer 204, the second buffer 205, and the third buffer 206 sequentially increase, and a CSB signal sequentially passes through the first buffer 204, the second buffer 205, and the third buffer 206 to obtain a target CS signal (denoted by CSBI). Driving capabilities of the fourth buffer 209 and the fifth buffer 210 also sequentially increase, a CSB signal passes through the first inverter 207 and is inputted together with a CA signal into the first AND gate 208, and an output signal of the first AND gate 208 sequentially passes through the fourth buffer 209 and the fifth buffer 210 to obtain a target CA signal (denoted by CMD/ADD_RPT). Driving capabilities of the sixth buffer 212 and the seventh buffer 213 also sequentially increase, a CSB signal passes through the first inverter 207 and is then inputted together with a CLK signal into the second AND gate 211, and an output signal of the second AND gate 211 sequentially passes through the sixth buffer 212 and the seventh buffer 213 to obtain a target clock signal (denoted by CLK_RPT).

After being obtained, CSBI, CMD/ADD_RPT and CLK_RPT may be decoded. Specifically, the inputted CSBI and CMD/ADD_RPT are sampled via the DFF 214 by using CLK_RPT to obtain a sampled CS signal (denoted by CSB_INTER) and a sampled CA signal (denoted by CMD/ADD_INTER), then CSB_INTER passes through the second inverter 215 to be inputted together with CMD/ADD_INTER into the third AND gate 216, and eventual decoding is performed to obtain a target command result (denoted by CMD/ADD_OUT). It is to be noted that the D flip-flop 214 is not a single DFF and may be a plurality of DFFs. FIG. 2 only shows one symbol mark, and may be denoted by DFF_top, which is only used for representing a sampling function of a CA signal by the DFF.

Figure 3:
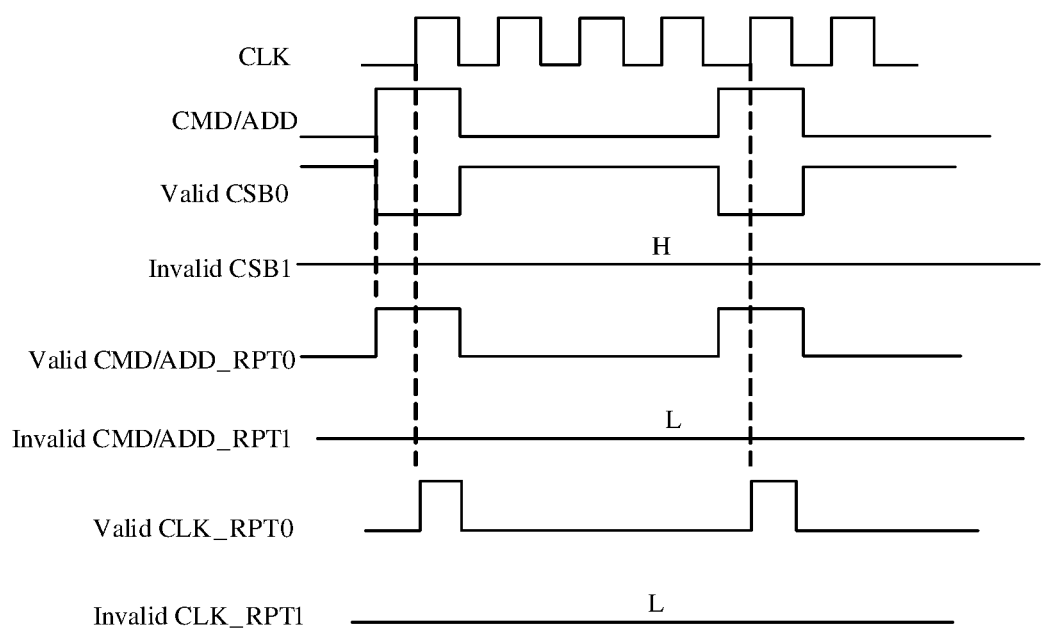
FIG. 3 is a schematic timing diagram of signals of a signal masking circuit.

According to the circuit structure illustrated in FIG. 2, a signal timing diagram corresponding to the circuit structure is illustrated in FIG. 3. In FIG. 3, a valid CSB signal (denoted by Valid CSB0) is an active-low pulse signal with a pulse width of one clock period, and is used for representing that a rank connected to the signal Valid CSB0 is selected. An invalid CSB signal (denoted by Invalid CSB1) is a high-level signal and is used for representing that a rank connected to the Invalid CSB1 signal is not selected. In this case, a valid target CA signal (denoted by Valid CMD/ADD_RPT0) is also a pulse signal and has a pulse width of one clock period. That is, the target CA signal is allowed to pass through within a time period during which Valid CSB0 is low, and remains at a low level within other time periods. An invalid target CA signal (denoted by Invalid CMD/ADD_RPT1) is a low-level signal. In addition, a valid target clock signal (denoted by Valid CLK_RPT0) is also a pulse signal, and the target clock signal is allowed to pass through within a time period during which Valid CSB0 is low, and remains at a low level within other time periods. An invalid target clock signal (denoted by Invalid CLK_RPT1) is a low-level signal. The high-level signal is denoted by H, and the low-level signal is denoted by L.

In short, when CS_n is used to mask a CA signal, it can be known from the signal timing illustrated in FIG. 3 that power consumption of a buffer and a DFF in an Invalid CS Rank can be reduced in a CMD/ADD masking manner while the normal operation of a Valid CS Rank is ensured, so that current consumption of the Valid Rank when CS_n is at a high level can be reduced.

When CS_n is used to mask a clock signal, it can be known from the signal timing illustrated in FIG. 3 that power consumption of a buffer and a DFF in an Invalid CS Rank can be reduced in a CLK masking manner, and the saved current in the CLK masking manner is multiple times that in CMD/ADD masking manner (because the frequency of CLK is higher), so that current consumption of the Valid Rank when CS_n is at a high level can also be reduced.

Figure 4:
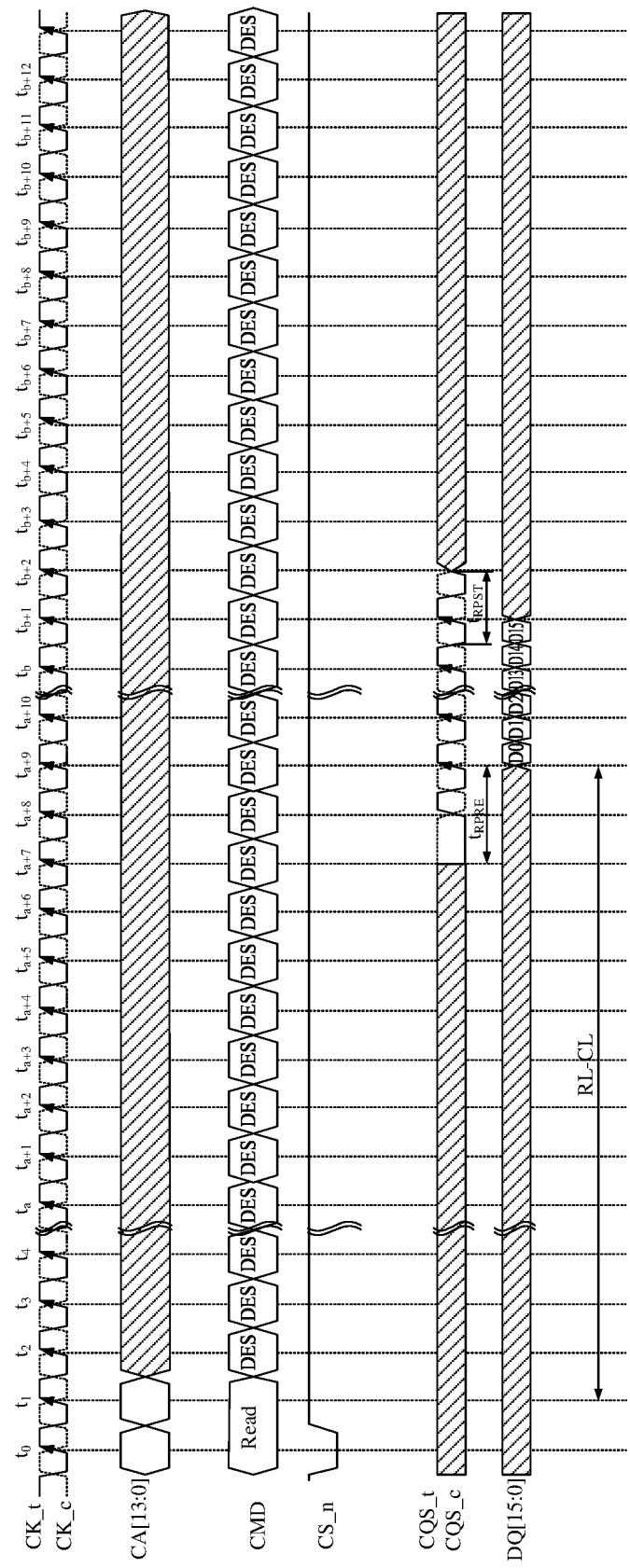
FIG. 4 is a schematic timing diagram of a read command of DDR5.

It may further be understood that for a DDR5 DRAM, within a read command (READ) or a write (WRITE) command, DDR5 may support BC8, BL16, BL32 (optional), and BL32 OTF (optional), and MR[1:0] is used for selecting a burst operation mode. FIG. 4 is a schematic timing diagram of a read command. In FIG. 4, one read command includes two clock periods. For example, <BA, BG> and <CA, BL, AP> correspond to one READ command.

Figure 5:
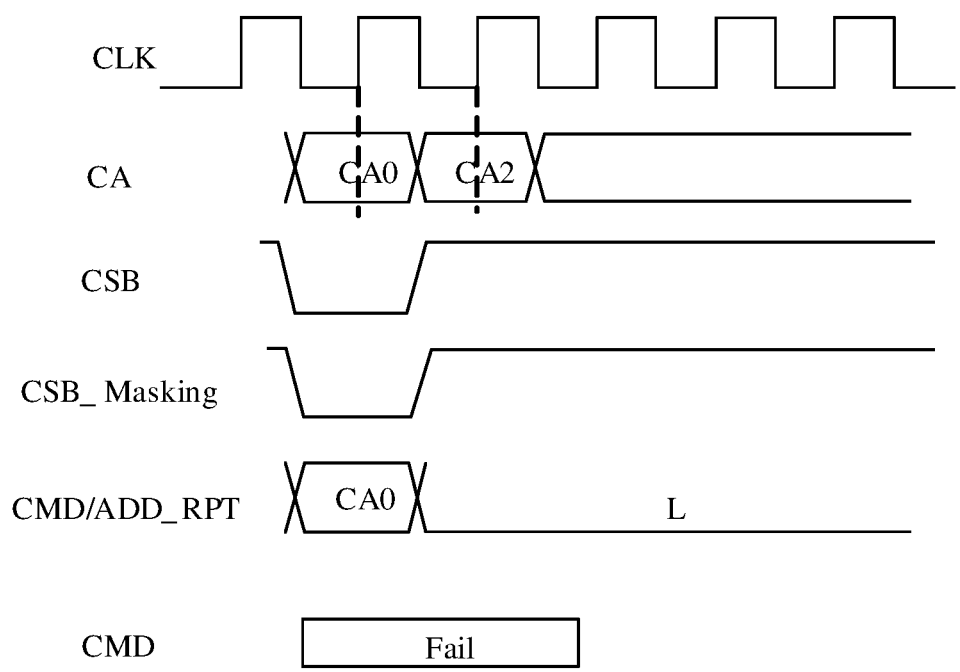
FIG. 5 is a schematic timing diagram of signals of DDR5.

However, for a DDR5 DRAM, the read command is a command based on two clock periods. If the conventional architecture is still used, for a valid DRAM, CA information within the second clock period may be lost to cause a CMD decoding failure (see FIG. 5 for details). As illustrated in FIG. 5, CLK denotes an initial clock signal, CA denotes an initial CA signal, CSB denotes an initial CS signal, CMD/ADD_RPT denotes a target CA signal, CSB_Masking denotes a CS masking signal, and CMD denotes a decoding result. As can be seen, CA includes CA0 and CA2, and CSB is an active-low pulse signal having a pulse width of only one clock period. As a result, a pulse width of CSB_Masking is also one clock period. In this case, when CA passes through CSB_Masking, only CA0 in the first clock period is allowed to pass through, and CA2 in the second clock period is lost, resulting in a CMD decoding failure.

Figure 6:
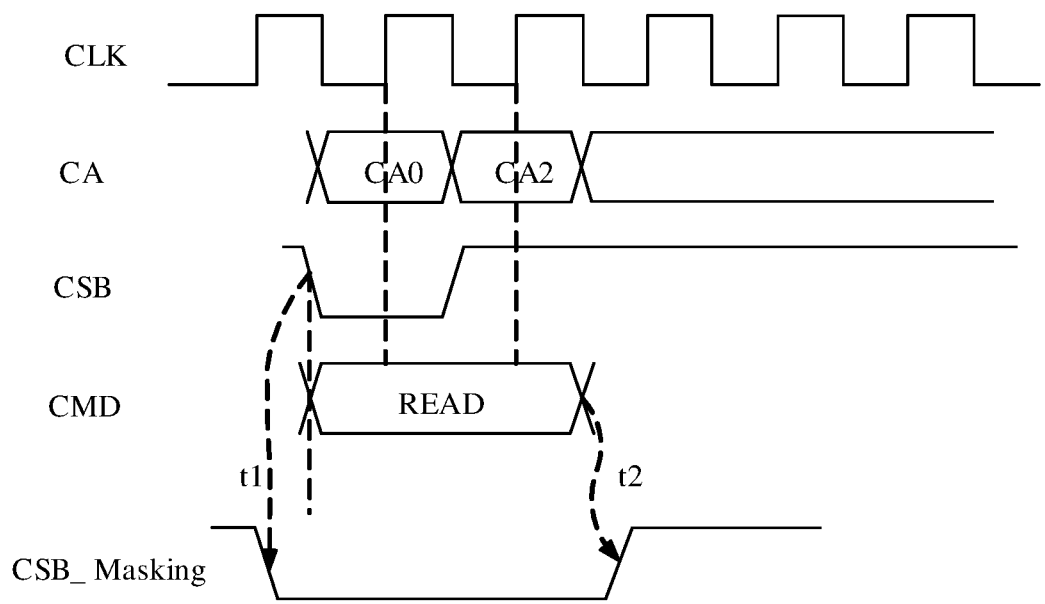
FIG. 6 is another schematic timing diagram of signals of DDR5.

In this case, because a falling edge of CS_n of DDR5 is synchronous with a CMD/ADD, when CS_n is used to generate CSB_Masking to reduce power consumption, a falling edge of CSB_Masking needs to be earlier than CA in theory. FIG. 6 is another schematic timing diagram of signals of DDR5. As illustrated in FIG. 6, a timing reference of CSB_Masking of DDR5 is provided, and FIG. 6 illustrates a target status in an ideal case. t1 indicates that a falling edge time of CSB_Masking is earlier than CA, and t2 indicates that a rising edge time of CSB_Masking is later than CA. In other words, the urgent problem to be solved by the disclosure is how to minimize power consumption while ensuring that no information is lost during CMD decoding of a valid DRAM.

Embodiments of the disclosure provide a signal masking circuit. The signal masking circuit includes a receiving circuit, a delay control circuit, and a logical operation circuit. The receiving circuit is configured to receive a signal to be processed and a CS signal, and output an initial processing signal and an initial CS signal. The delay control circuit is configured to perform delay and logical control operations on the initial CS signal to obtain a CS masking signal, and a pulse width of the CS masking signal is greater than or equal to two preset clock periods. The logical operation circuit is configured to perform invalid masking on the initial processing signal according to the CS masking signal to obtain a target signal. In this way, because a CA signal in a DDR5 DRAM is a signal based on two preset clock periods and a pulse width of the CS masking signal provided in the disclosure is greater than or equal to two preset clock periods, during masking of an initial processing signal, the current waste can be minimized to reduce power consumption while ensuring that the DDR5 DRAM does not lose valid information.

The embodiments of the disclosure are described below in detail with reference to the accompanying drawings.

Figure 7:
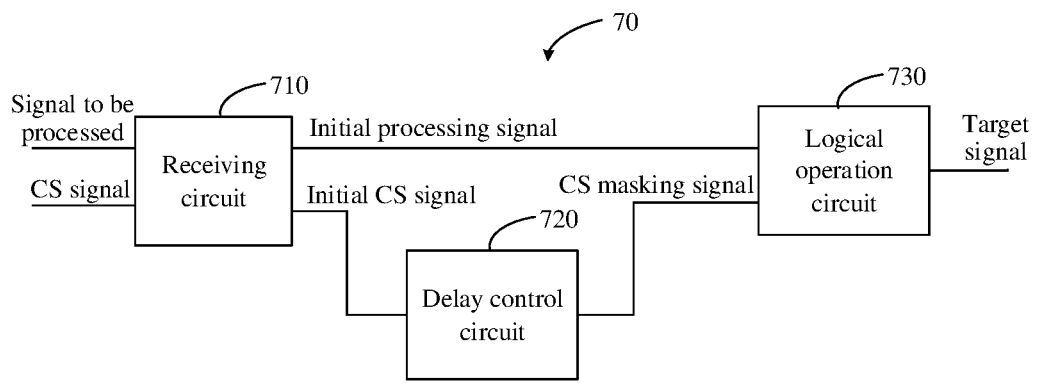
FIG. 7 is a first schematic structural diagram of a signal masking circuit according to an embodiment of the disclosure.

In an embodiment of the disclosure, FIG. 7 is a schematic structural diagram of a signal masking circuit 70 according to an embodiment of the disclosure. As illustrated in FIG. 7, the signal masking circuit 70 may include a receiving circuit 710, a delay control circuit 720, and a logical operation circuit 730.

The receiving circuit 710 is configured to receive a signal to be processed and a CS signal, and output an initial processing signal and an initial CS signal.

The delay control circuit 720 is configured to perform delay and logical control operations on the initial CS signal to obtain a CS masking signal. A pulse width of the CS masking signal is greater than or equal to two preset clock periods.

The logical operation circuit 730 is configured to perform invalid masking on the initial processing signal according to the CS masking signal to obtain a target signal.

It is to be noted that in the embodiments of the disclosure, the CS signal is denoted by CS_n, and the initial CS signal is denoted by CSB. The CS signal may be a signal representing whether a chip is selected, the CS signal is an active-low pulse signal, and has a pulse width of one preset clock period.

It further needs to be noted that in the embodiments of the disclosure, the signal to be processed may include at least one of the following: a CA signal or a clock signal. A period of the clock signal is equal to the preset clock period.

Correspondingly, the initial processing signal obtained after passing through the receiving circuit 710 may include one of an initial CA signal and an initial clock signal.

The receiving circuit 710 may be a receiver or may be a buffer. In addition, the CA signal is denoted by CMD/ADD, and the initial CA signal is denoted by CA; and the clock signal is denoted by CK_t and CK_c, and the initial clock signal is denoted by CLK.

It further needs to be noted that in the embodiments of the disclosure, the CS masking signal is denoted by CS_Masking. In addition, CS and CSB denote signal inversion, i.e., CS_Masking may be considered as an inverted signal of CSB_Masking.

In some embodiments, the logical operation circuit 730 is specifically configured to, when the initial processing signal is a signal corresponding to a target chip, mask an invalid signal in the initial processing signal according to the CS masking signal; and/or, when the initial processing signal is a signal corresponding to a non-target chip, mask the initial processing signal completely according to the CS masking signal.

The target chip is a chip selected by the CS signal, and the non-target chip is a chip that is not selected by the CS signal.

It is to be noted that for the target chip, that is, a selected chip, the initial processing signal is valid, and the CS masking signal needs to be used to allow a valid part of the initial processing signal to pass through and mask the remaining invalid part of the initial processing signal. For the non-target chip, that is, a chip that is not selected, the initial processing signal is invalid in this case, and the CS masking signal needs to be used to completely mask the initial processing signal.

It further needs to be noted that because the CA signal is a command based on two preset clock periods, the pulse width of the CS masking signal needs to be greater than or equal to two preset clock periods, to avoid loss of CA information in the second clock period.

Figure 8A:
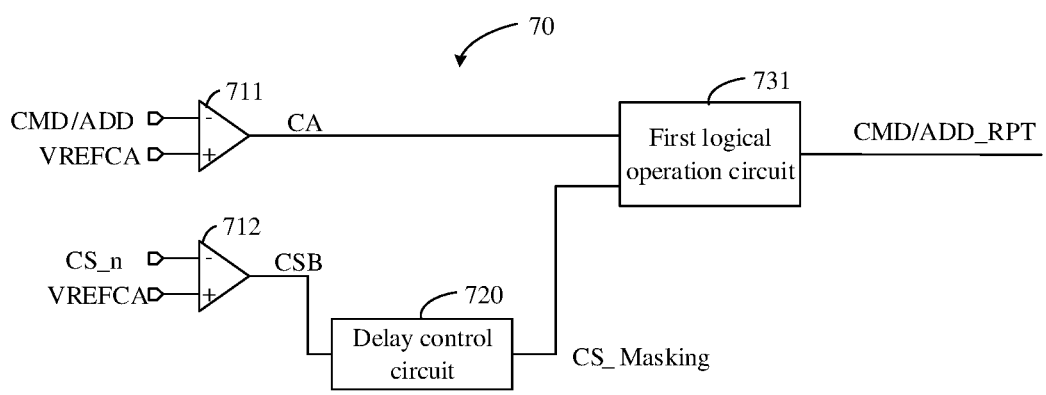
FIG. 8A is a second schematic structural diagram of a signal masking circuit according to an embodiment of the disclosure.

In a possible implementation, when the signal to be processed is the CA signal, the CS masking signal may be used to perform invalid masking on the signal to be processed. Referring to FIG. 8A, based on the signal masking circuit 70 illustrated in FIG. 7, the receiving circuit 710 may include a first receiving module 711 and a second receiving module 712, and the logical operation circuit 730 may include a first logical operation circuit 731.

The first receiving module 711 is configured to receive the CA signal, and output an initial CA signal.

The second receiving module 712 is configured to receive the CS signal, and output the initial CS signal.

The delay control circuit 720 is connected to an output terminal of the second receiving module 712, and is configured to perform the delay and logical control operations on the initial CS signal to obtain the CS masking signal.

The first logical operation circuit 731 is connected to an output terminal of the delay control circuit 720 and an output terminal of the first receiving module 711, and is configured to perform a logical operation on the CS masking signal and the initial CA signal to obtain a target CA signal.

It is to be noted that in the embodiments of the disclosure, in FIG. 8A, the CS masking signal is used to mask the initial CA signal. For a chip that is not selected, the initial CA signal is an invalid signal, and may be masked by the first logical operation circuit 731 completely. For a chip that is selected, the initial CA signal is a valid signal, and a valid part in the initial CA signal may pass through the first logical operation circuit 731, i.e., the target CA signal is obtained. The target CA signal may be denoted by CMD/ADD_RPT.

Figure 8B:
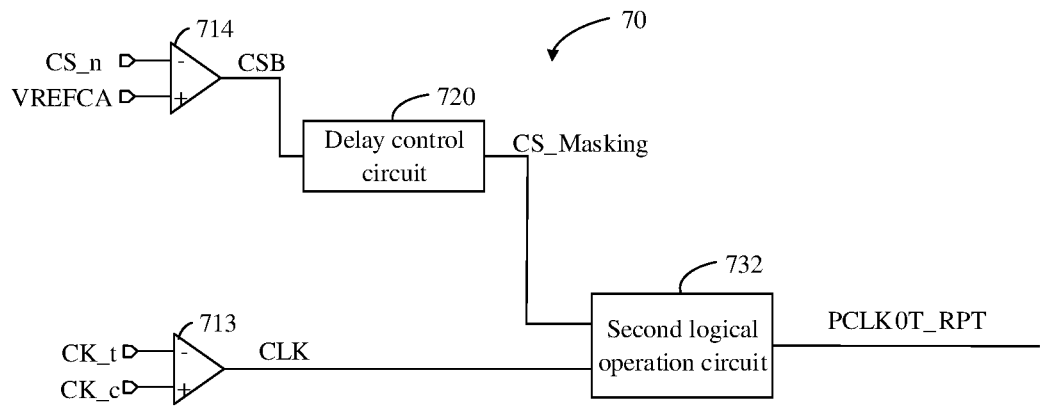
FIG. 8B is a third schematic structural diagram of a signal masking circuit according to an embodiment of the disclosure.

In another possible implementation, when the signal to be processed is the clock signal, the CS masking signal may be used to perform invalid masking on the signal to be processed. Referring to FIG. 8B, based on the signal masking circuit 70 illustrated in FIG. 7, the receiving circuit 710 may include a third receiving module 713 and a fourth receiving module 714, and the logical operation circuit 730 may include a second logical operation circuit 732.

The third receiving module 713 is configured to receive the clock signal, and output an initial clock signal.

The fourth receiving module 714 is configured to receive the CS signal, and output the initial CS signal.

The delay control circuit 720 is connected to an output terminal of the fourth receiving module 714, and is configured to perform the delay and logical control operations on the initial CS signal to obtain the CS masking signal.

The second logical operation circuit 732 is connected to an output terminal of the delay control circuit 720 and an output terminal of the third receiving module 713, and is configured to perform a logical operation on the CS masking signal and the initial clock signal to obtain a target clock signal.

It is to be noted that in the embodiments of the disclosure, in FIG. 8B, the CS masking signal is used to mask the initial clock signal. For a chip that is not selected, the initial clock signal is an invalid signal, and may be masked by the second logical operation circuit 732 completely. For a chip that is selected, the initial clock signal is a valid signal, and a valid part in the initial clock signal may pass through the second logical operation circuit 732, i.e., the target clock signal is obtained. The target clock signal may be denoted by PCLK0T_RPT.

Figure 8C:
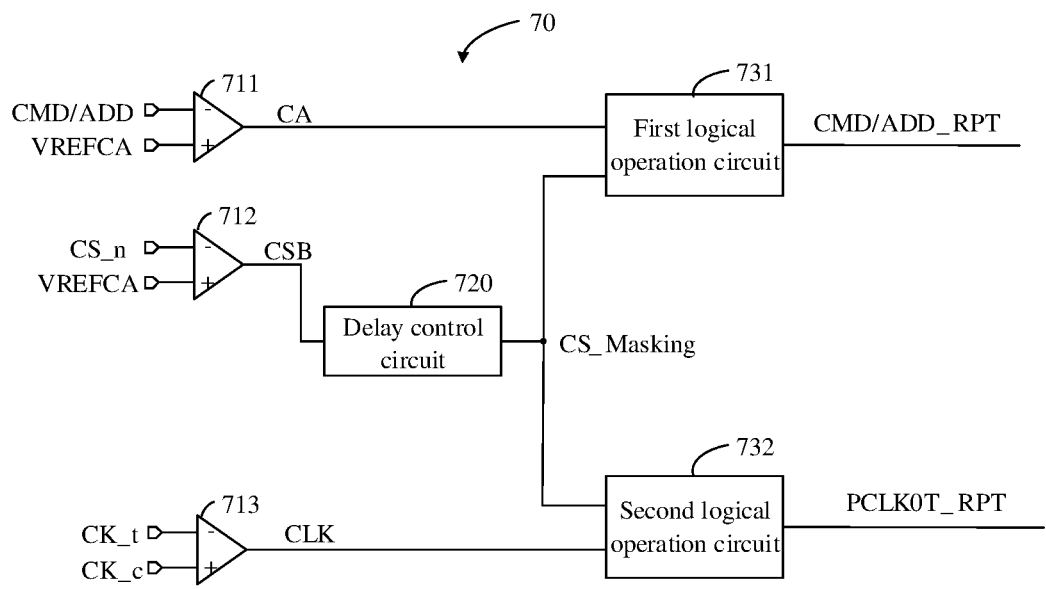
FIG. 8C is a fourth schematic structural diagram of a signal masking circuit according to an embodiment of the disclosure.

In another possible implementation, when the signal to be processed is the CA signal and the clock signal, the CS masking signal may be used to perform invalid masking on the CA signal and the clock signal separately. Referring to FIG. 8C, based on the signal masking circuit 70 illustrated in FIG. 7, the receiving circuit 710 may include a first receiving module 711, a second receiving module 712, and a third receiving module 713, and the logical operation circuit 730 may include a first logical operation circuit 731 and a second logical operation circuit 732.

The first receiving module 711 is configured to receive the CA signal, and output an initial CA signal.

The second receiving module 712 is configured to receive the CS signal, and output the initial CS signal.

The third receiving module 713 is configured to receive the clock signal, and output an initial clock signal.

The delay control circuit 720 is connected to an output terminal of the second receiving module 712, and is configured to perform the delay and logical control operations on the initial CS signal to obtain the CS masking signal.

The first logical operation circuit 731 is connected to an output terminal of the delay control circuit 720 and an output terminal of the first receiving module 711, and is configured to perform invalid masking on the initial CA signal according to the CS masking signal to obtain a target CA signal.

The second logical operation circuit 732 is connected to an output terminal of the delay control circuit 720 and an output terminal of the third receiving module 713, and is configured to perform a logical operation on the CS masking signal and the initial clock signal to obtain a target clock signal.

It is to be noted that in the embodiments of the disclosure, in FIG. 8C, the CS masking signal is used to mask the initial CA signal and the initial clock signal. For a chip that is not selected, the initial CA signal and the initial clock signal are both invalid signals, and may be masked by the first logical operation circuit 731 and the second logical operation circuit 732 completely. For a chip that is selected, the initial CA signal and the initial clock signal are both valid signals, a valid part in the initial CA signal may pass through the first logical operation circuit 731 to obtain the target CA signal, and a valid part in the initial clock signal may pass through the second logical operation circuit 732 to obtain the target clock signal.

It is further to be noted that for the receiving circuit 710, each of the first receiving module, the second receiving module, and the third receiving module may be considered as one receiver or buffer. In addition, the CS masking signal is denoted by CS_Masking, the target CA signal may be denoted by CMD/ADD_RPT, and the target clock signal may be denoted by PCLK0T_RPT.

Figure 9A:
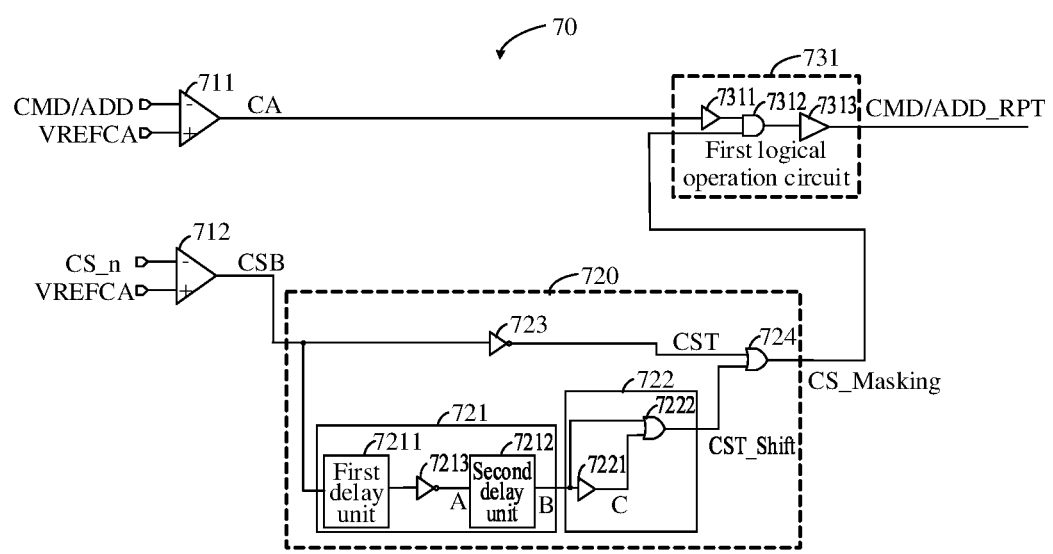
FIG. 9A is a fifth schematic structural diagram of a signal masking circuit according to an embodiment of the disclosure.
Figure 9B:
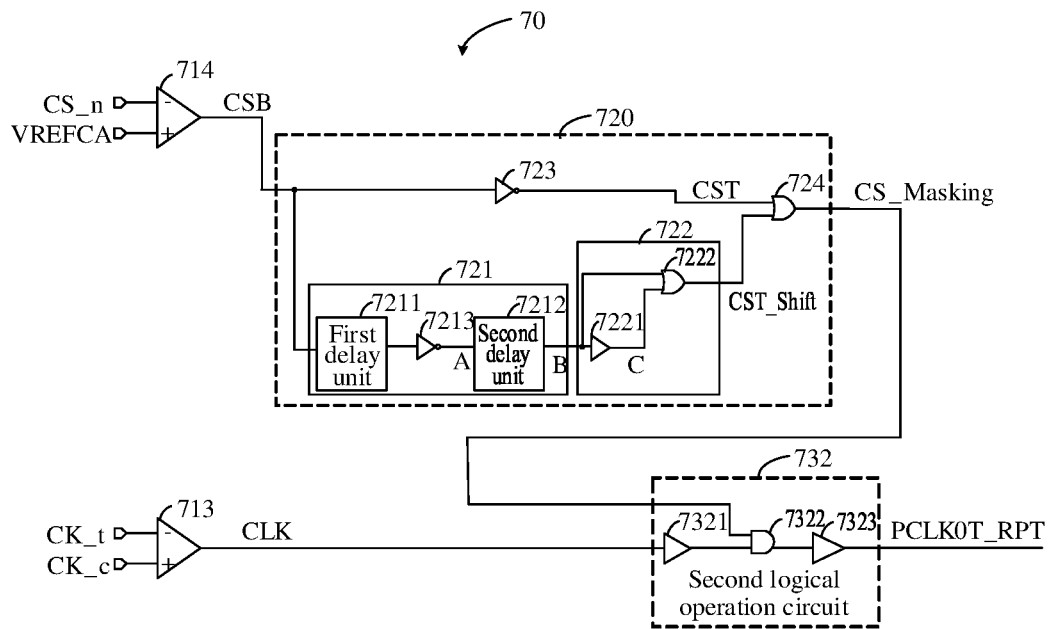
FIG. 9B is a sixth schematic structural diagram of a signal masking circuit according to an embodiment of the disclosure.
Figure 9C:
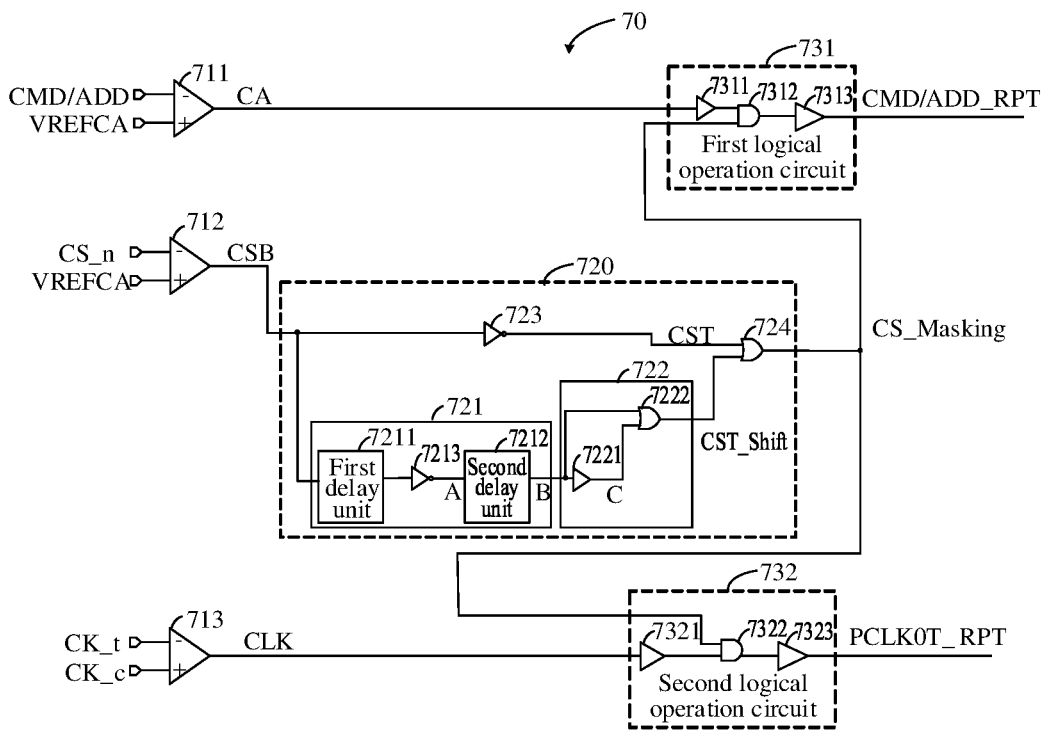
FIG. 9C is a seventh schematic structural diagram of a signal masking circuit according to an embodiment of the disclosure.

Further, in some embodiments, for the first logical operation circuit 731, based on the signal masking circuit 70 illustrated in FIG. 8A or FIG. 8C, referring to FIG. 9A or FIG. 9C for details, the first logical operation circuit 731 may include a first buffer 7311, a first AND gate 7312, and a second buffer 7313.

The first buffer 7311 is connected to the first receiving module 711, and is configured to perform driving enhancement and delay processing on the initial CA signal to obtain a first CA signal.

The first AND gate 7312 is connected to an output terminal of the first buffer 7311 and the output terminal of the delay control circuit 720, and is configured to perform an AND operation on the CS masking signal and the first CA signal to obtain a second CA signal.

The second buffer 7313 is connected to an output terminal of the first AND gate 7312, and is configured to perform driving enhancement and delay processing on the second CA signal to obtain the target CA signal.

That is, after the first CA signal and the CS masking signal are obtained, the first CA signal and the CS masking signal may be subjected to a logical operation by the first AND gate 7312, then may be subjected to driving enhancement and delay processing by the second buffer 7313, and the eventually obtained target CA signal may be denoted by CMD/ADD_RPT.

Further, in some embodiments, for the second logical operation circuit 732, based on the signal masking circuit 70 illustrated in FIG. 8B or FIG. 8C, referring to FIG. 9B or FIG. 9C for details, the second logical operation circuit 732 may include a third buffer 7321, a second AND gate 7322, and a fourth buffer 7323.

The third buffer 7321 is connected to the third receiving module 713, and is configured to perform driving enhancement and delay processing on the initial clock signal to obtain a first clock signal.

The second AND gate 7322 is connected to an output terminal of the third buffer 7321 and the output terminal of the delay control circuit 720, and is configured to perform an AND operation on the CS masking signal and the first clock signal to obtain a second clock signal.

The fourth buffer 7323 is connected to an output terminal of the second AND gate 7322, and is configured to perform driving enhancement and delay processing on the second clock signal to obtain the target clock signal.

That is, after the first clock signal and the CS masking signal are obtained, the first clock signal and the CS masking signal may be subjected to a logical operation by the second AND gate 7322, then may be subjected to driving enhancement and delay processing by the fourth buffer 7323, and the eventually obtained target clock signal may be denoted by PCLK0T_RPT.

Further, in some embodiments, for the delay control circuit 720, based on the signal masking circuit 70 illustrated in FIG. 8A, FIG. 8B or FIG. 8C, referring to FIG. 9A, FIG. 9B or FIG. 9C for details, the delay control circuit 720 may include a delay module 721, a pulse width adjustment module 722, a first inverter 723, and a first OR gate 724.

The first inverter 723 is configured to invert the initial CS signal to obtain a first intermediate signal.

The delay module 721 is configured to delay the initial CS signal to obtain a second intermediate signal.

The pulse width adjustment module 722 is configured to perform pulse width extension on the second intermediate signal to obtain a third intermediate signal.

The first OR gate 724 is connected to an output terminal of the first inverter 723 and an output terminal of the pulse width adjustment module 722, and is configured to perform an OR operation on the first intermediate signal and the third intermediate signal to obtain the CS masking signal.

It is to be noted that in the embodiments of the disclosure, the first intermediate signal may be denoted by CST, the second intermediate signal may be denoted by B, and the third intermediate signal may be denoted by CST_Shift. In this way, as illustrated in FIG. 9, after the first OR gate 724 performs a logical operation on CST and CST_Shift, an obtained CS masking signal is denoted by CS_Masking.

It is further to be noted that in the embodiments of the disclosure, a rising edge time of the CS masking signal is earlier than a pulse start time of the first CA signal, and a falling edge time of the CS masking signal is later than a pulse end time of the first CA signal. The CS masking signal and the first CA signal correspond to one same valid pulse of the CS signal.

Further, to achieve that the rising edge time of the CS masking signal is earlier than the pulse start time of the first CA signal and the falling edge time of the CS masking signal is later than the pulse end time of the first CA signal, in some embodiments, for the delay module 721, the delay module 721 may include a first delay unit 7211, a second delay unit 7212, and a second inverter 7213, and the second inverter 7213 is located between the first delay unit 7211 and the second delay unit 7212.

The first delay unit 7211 is configured to perform a first delay processing on the initial CS signal to obtain a first delay signal.

The second inverter 7213 is configured to invert the first delay signal to obtain an inverted delay signal.

The second delay unit 7212 is configured to perform a second delay processing on the inverted delay signal to obtain the second intermediate signal.

Further, in some embodiments, for the pulse width adjustment module 722, the pulse width adjustment module 722 may include a fifth buffer 7221 and a second OR gate 7222.

The fifth buffer 7221 is connected to an output terminal of the delay module 721, and is configured to perform driving enhancement and delay processing on the second intermediate signal to obtain a fourth intermediate signal.

The second OR gate 7222 is connected to the output terminal of the delay module 721 and an output terminal of the fifth buffer 7221, and is configured to perform an OR operation on the second intermediate signal and the fourth intermediate signal to obtain the third intermediate signal.

It is to be noted that in the embodiments of the disclosure, each of the first delay unit 7211 and the second delay unit 7212 is formed by a resistor R and a capacitor C. That is, the embodiments of the disclosure may be implemented by using two groups of RC delay networks. For example, the first delay unit 7211 may be formed by a first resistor R1 and a first capacitor C1, the second delay unit 7212 may be formed by a second resistor R2 and a second capacitor C2, and the second inverter 7213 is connected in series between the first resistor R1 and the second resistor R2.

It is further to be noted that in the embodiments of the disclosure, the pulse width adjustment module 722 may determine an extension width of the pulse width of the third intermediate signal, and a size of the extension width of the third intermediate signal is specifically determined according to a design requirement. In addition, an inverted delay signal obtained by the second inverter 7213 may be denoted by A, the second intermediate signal obtained by the second delay unit 7212 may be denoted by B, the fourth intermediate signal obtained by the fifth buffer 7221 may be denoted by C, and the third intermediate signal obtained by the second OR gate 7222 may be denoted by CST_Shift.

Figure 10:
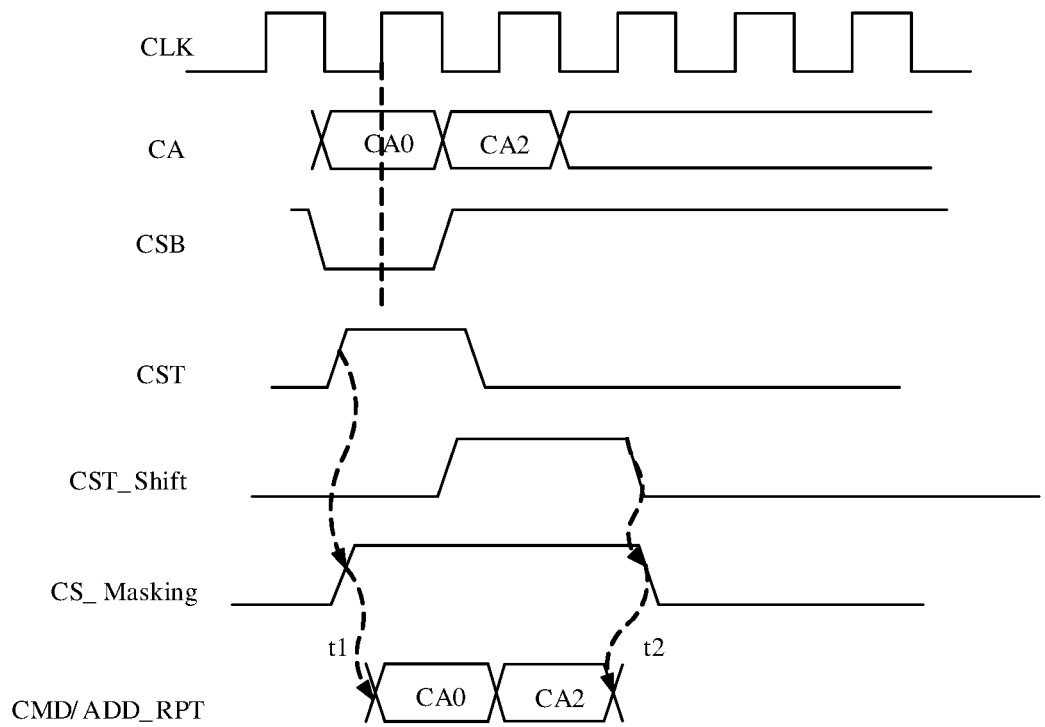
FIG. 10 is a first schematic timing diagram of signals of a signal masking circuit according to an embodiment of the disclosure.

In a specific example, FIG. 10 is a schematic timing diagram of signals of the signal masking circuit 70 according to an embodiment of the disclosure. As illustrated in FIG. 10, CA is an initial CA signal based on two preset clock periods and includes valid information CA0 and CA2. CSB is an active-low pulse signal having a pulse width of one preset clock period, and after inversion of the first inverter 723, an obtained CST signal is an active-high pulse signal, and still has the pulse width of one preset clock period. After the logical operation by the delay module 721 and the pulse width adjustment module 722, an obtained CST_Shift signal is an active-high pulse signal, and the pulse width of the CST_Shift signal is far greater than one preset clock period. In this way, after the first OR gate 724 performs an OR operation on the CST signal and the CST_Shift signal, the obtained CS_Masking signal is an active-high pulse signal, and the pulse width is greater than or equal to two preset clock periods, so that CA0 and CA2 can pass through to obtain a CMD/ADD_RPT signal.

That is, the embodiments of the disclosure may use a manner of an RC delay network in combined with a manner of logical control to ensure the sufficiency of t1/t2. A delay of an RC network is less than one preset clock period (that is, 1tCK). According to a rate requirement and a design requirement, two groups of RC networks may be used, to ensure integrity of the CSB signal. Specifically, while a delay is ensured, an inverter (that is, the second inverter 7213) may be further added between the two groups of RC delay networks, thereby effectively protecting the integrity of CSB information. In addition, the RC networks can reach a required delay nearly without consuming an extra current, and the use of the pulse width adjustment module 722 can ensure that t2 has a sufficient margin.

The embodiments provide a signal masking circuit. The signal masking circuit includes a receiving circuit, a delay control circuit, and a logical operation circuit. The receiving circuit is configured to receive a signal to be processed and a CS signal, and output an initial processing signal and an initial CS signal. The delay control circuit is configured to perform delay and logical control operations on the initial CS signal to obtain a CS masking signal, and a pulse width of the CS masking signal is greater than or equal to two preset clock periods. The logical operation circuit is configured to perform invalid masking on the initial processing signal according to the CS masking signal to obtain a target signal. In this way, because a CA signal in a DDR5 DRAM is a signal based on two preset clock periods and a pulse width of the CS masking signal provided in the disclosure is greater than or equal to two preset clock periods, during masking of an initial processing signal, a current waste can be minimized to reduce power consumption while ensuring that the DDR5 DRAM does not lose valid information.

In another embodiment of the disclosure, based on the signal masking circuit 70 in the foregoing embodiments, after the target CA signal and the target clock signal are obtained, the target CA signal may be further decoded. Taking the signal masking circuit 70 illustrated in FIG. 8C as an example, referring to FIG. 11, based on the signal masking circuit 70 illustrated in FIG. 8C, the signal masking circuit 70 may further include a buffer module 740. The buffer module 740 may be formed by a plurality of sixth buffers 741.

The buffer module 740 is configured to perform driving enhancement and delay processing on the initial CS signal according to the plurality of sixth buffers 741 to obtain a target CS signal.

It is to be noted that as illustrated in FIG. 10, the buffer module 740 may be formed by three sixth buffers, and the three sixth buffers may have the same driving capability or different driving capabilities (for example, the driving capabilities gradually increase). In this case, the obtained target CS signal may be denoted by CSBI.

It is further to be noted that in the embodiments of the disclosure, any of the first buffer, the second buffer, the third buffer, the fourth buffer, the fifth buffer or the sixth buffer may be formed by two inverters, and therefore the buffer may also be referred as a repeater, RPT for short.

Figure 11:
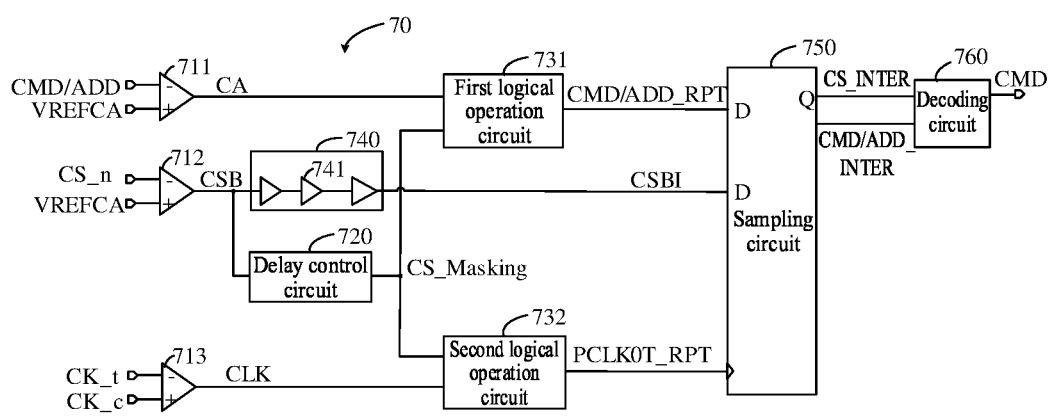
FIG. 11 is an eighth schematic structural diagram of a signal masking circuit according to an embodiment of the disclosure.

Further, in some embodiments, as illustrated in FIG. 11, the signal masking circuit 70 may further include a sampling circuit 750 and a decoding circuit 760.

The sampling circuit 750 is configured to receive the target CA signal, the target clock signal, and the target CS signal, and sample the target CA signal and the target CS signal by using the target clock signal to obtain a sampled CA signal and a sampled CS signal.

The decoding circuit 760 is connected to an output terminal of the sampling circuit 750, and configured to decode the sampled CS signal and the sampled CA signal to obtain a target command result.

It is to be noted that in the embodiments of the disclosure, the sampling circuit 750 may be formed by a plurality of DFFs. In addition, the decoding circuit 760 may include a third inverter and a third AND gate (not illustrated).

The third inverter is configured to invert the sampled CS signal to obtain an inverted sampled CS signal.

The third AND gate is configured to perform an AND operation on the inverted sampled CS signal and the sampled CA signal to obtain the target command result.

It is further to be noted that in the embodiments of the disclosure, the sampled CS signal may be denoted by CS_INTER, the sampled CA signal may be denoted by CMD/ADD_INTER, and the target command result may be denoted by CMD.

The signal masking circuit provided in the embodiments of the disclosure can minimize power consumption while ensuring the performance Detailed description is provided below with reference to two specific circuit structures.

Figure 12:
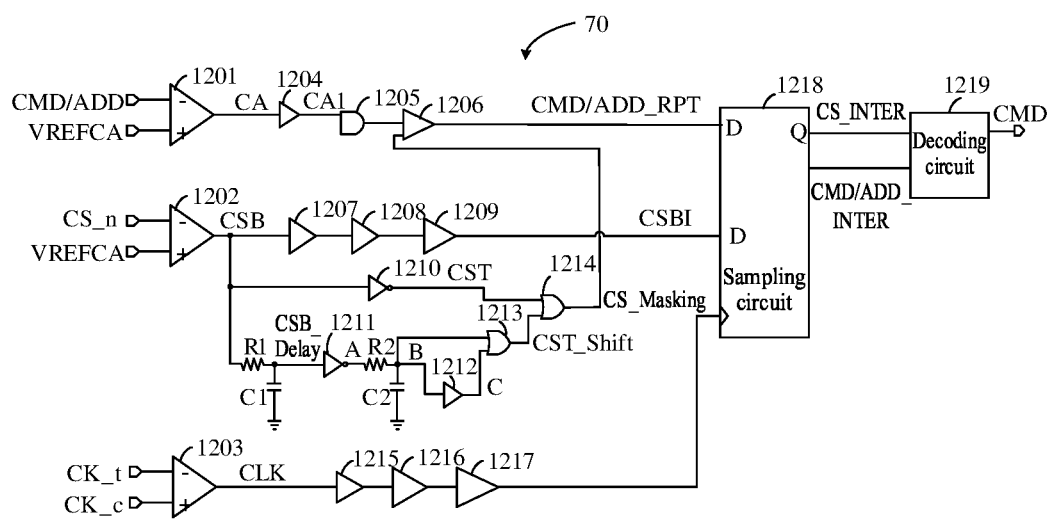
FIG. 12 is a schematic diagram of a specific circuit structure of a signal masking circuit according to an embodiment of the disclosure.

In a specific example, FIG. 12 is a schematic diagram of a specific circuit structure of a signal masking circuit 70 according to an embodiment of the disclosure. As illustrated in FIG. 12, the signal masking circuit 70 may include a first receiver 1201, a second receiver 1202, a third receiver 1203, a first buffer 1204, a first AND gate 1205, a second buffer 1206, a third buffer 1207, a fourth buffer 1208, a fifth buffer 1209, a first inverter 1210, a second inverter 1211, a first resistor R1, a first capacitor C1, a second resistor R2, a second capacitor C2, a sixth buffer 1212, a first OR gate 1213, a second OR gate 1214, a seventh buffer 1215, an eighth buffer 1216, a ninth buffer 1217, a sampling circuit 1218, and a decoding circuit 1219. The first receiver 1201, the second receiver 1202, and the third receiver 1203 may be buffers. The sampling circuit 1218 may be formed by a plurality of DFFs. In addition, the first buffer 1204, the first AND gate 1205, and the second buffer 1206 form a first logical operation circuit. The first resistor R1 and the first capacitor C1 form a first delay unit. The second resistor R2 and the second capacitor C2 form a second delay unit. The sixth buffer 1212 and the first OR gate 1213 form a pulse width adjustment module.

According to the signal masking circuit 70 illustrated in FIG. 12, the circuit performs masking on a CA signal by using a CS masking signal, to avoid a current waste and reduce power consumption.

Figure 13A:
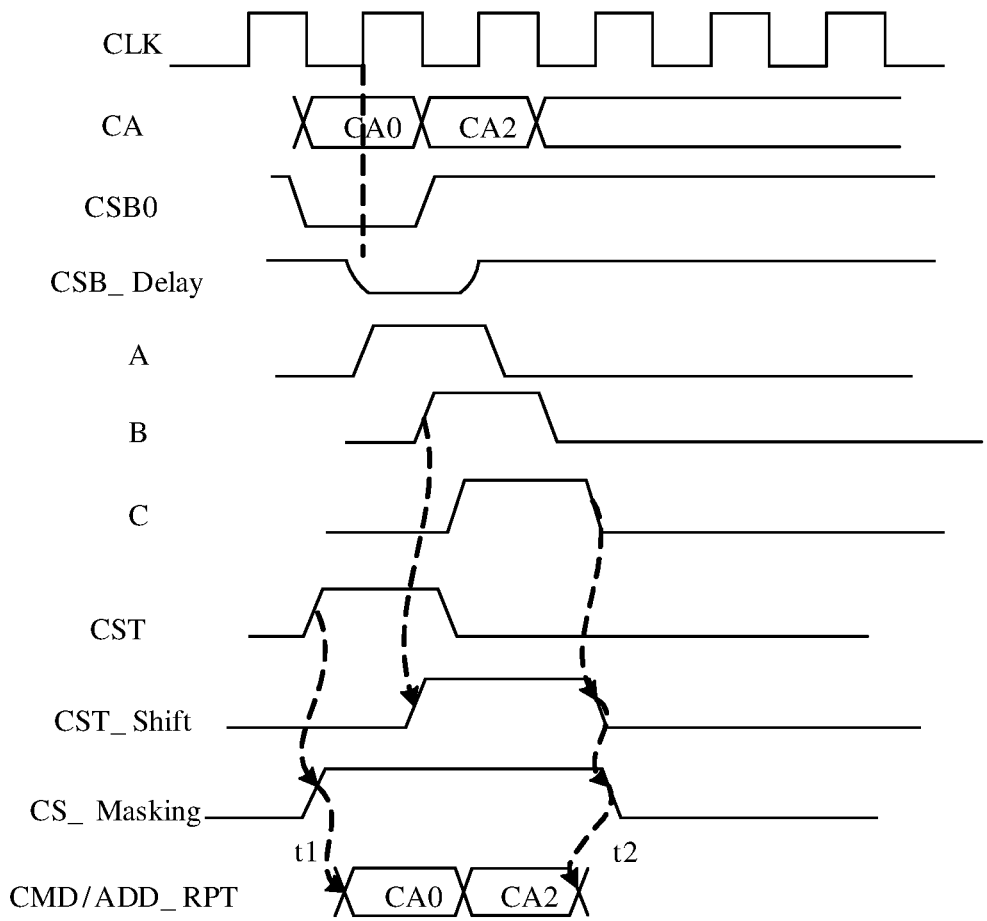
FIG. 13A is a second schematic timing diagram of signals of a signal masking circuit according to an embodiment of the disclosure.

FIG. 13A is a schematic timing diagram of signals of the signal masking circuit 70 illustrated in FIG. 12 when the CA signal is a valid signal. An initial CA signal outputted by the first receiver 1201 is denoted by CA, and valid parts of the initial CA signal include two preset clock periods (CA0 and CA2). An initial CS signal outputted by the second receiver 1202 is denoted by CSB0. The initial CS signal is an active-low pulse signal, and has a pulse width of one preset clock period. An initial clock signal outputted by the third receiver 1203 is denoted by CLK. After the CSB0 signal is inverted by the first inverter 1210, the obtained signal is denoted by CST and is an active-high pulse signal. After the CSB0 signal passes through the first delay network formed by the first resistor R1 and the first capacitor C1, an obtained signal is denoted by CSB_Delay. As can be seen from FIG. 13A, there is a delay between CSB_Delay and CSB0. After the CSB_Delay signal is inverted by the second inverter 1211, an obtained signal is denoted by A. As can be seen from FIG. 13A, the A signal is an active-high pulse signal. The second inverter 1211 has the function of improving a signal driving capability, and thus the signal integrity of the A signal is significantly improved as compared with CSB_Delay. Further, after the A signal passes through the second delay network formed by the second resistor R2 and the second capacitor C2, an obtained signal is denoted by B. As can be seen from FIG. 13A, the B signal is still an active-high pulse signal, and there is a delay between the B signal and the A signal. Further, after the sixth buffer 1212 performs driving enhancement and delay processing on the B signal, an obtained signal is denoted by C. After the first OR gate 1213 performs an OR operation on the B signal and the C signal, pulse widths of the signals can be extended, and in such case, the obtained signal is denoted by CST_Shift. As can be seen from FIG. 13A, a pulse width of the CST_Shift signal is extended, a rising edge of the pulse is affected by a rising edge of the B signal, and a falling edge of the pulse is affected by a falling edge of the C signal. Further, after the second OR gate 1214 performs an OR operation on the CST signal and the CST_Shift signal, an obtained signal is denoted by CS_Masking. As can be seen from FIG. 13A, a pulse width of CS_Masking has been extended to be greater than or equal to two preset clock periods, a rising edge of the pulse is affected by a rising edge of the CST signal, and a falling edge of the pulse is affected by a falling edge of the CST_Shift signal. In this way, after the first buffer 1204 performs driving enhancement and delay processing on the CA signal, the obtained first CA signal is denoted by CA1, and during invalid masking on the CA1 signal by using the CS_Masking signal, CA0 and CA2 are both allowed to pass through within a time period during which the CS_Masking signal is high. In this case, the obtained signal is the target CA signal, denoted by CMD/ADD_RPT.

Figure 13B:
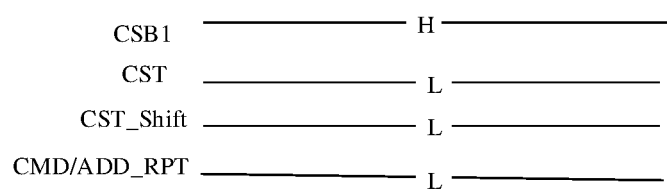
FIG. 13B is a third schematic timing diagram of signals of a signal masking circuit according to an embodiment of the disclosure.

FIG. 13B is a schematic timing diagram of signals of the signal masking circuit 70 illustrated in FIG. 12 when the CA signal is an invalid signal. As illustrated in FIG. 13B, an initial CS signal outputted by the second receiver 1202 is denoted by CSB1, and is a high-level signal (denoted by H). After the CSB1 signal is inverted by the first inverter 1210, the obtained CST signal is a low-level signal (denoted by L).

After the CSB1 signal passes through the first resistor R1, the first capacitor C1, the second inverter 1211, the second resistor R2, the second capacitor C2, the sixth buffer 1212, and the first OR gate 1213, the obtained CST_Shift signal is still a low-level signal, resulting in that the CA signal is completely masked. That is, in such case, the obtained target CA signal (CMD/ADD_RPT) is a low-level signal (denoted by L).

It is to be noted that FIG. 13A represents a case that a chip is selected, and FIG. 13B represents a case that a chip is not selected. Therefore, CSB0 in FIG. 13A is an active-low pulse signal, and CSB1 in FIG. 13B is a high-level signal. CSB0 and CSB1 are respectively used for indicating that a chip is selected and that a chip is not selected.

Figure 14:
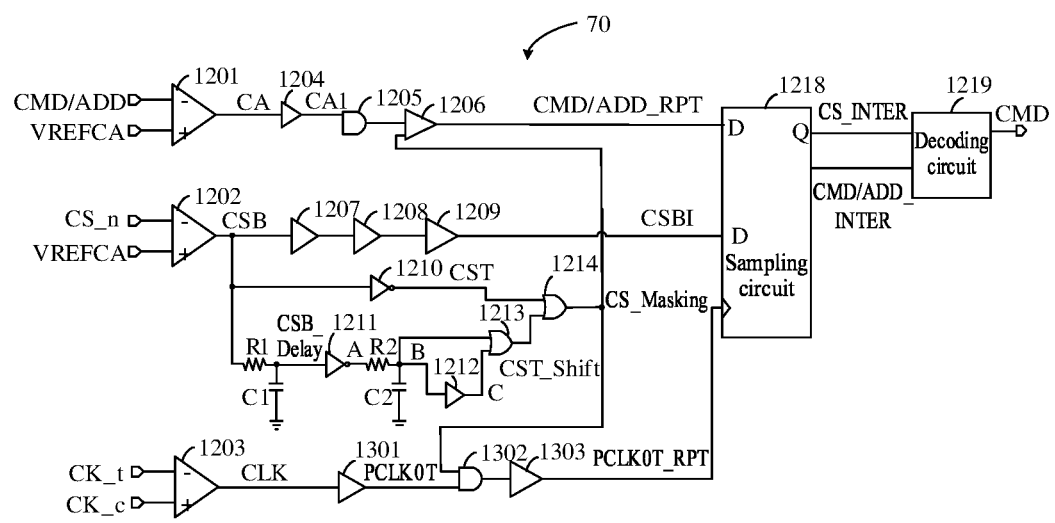
FIG. 14 is a second schematic diagram of a specific circuit structure of a signal masking circuit according to an embodiment of the disclosure.

In another specific example, FIG. 14 is a schematic diagram of a specific circuit structure of another signal masking circuit 70 according to an embodiment of the disclosure. As illustrated in FIG. 14, based on the signal masking circuit 70 illustrated in FIG. 12, the signal masking circuit 70 may further include a tenth buffer 1301, a second AND gate 1302, and an eleventh buffer 1303. The tenth buffer 1301, the second AND gate 1302, and the eleventh buffer 1303 form a second logical operation circuit, and are used to replace the seventh buffer 1215, the eighth buffer 1216, and the ninth buffer 1217 in FIG. 12.

For the signal masking circuit 70 illustrated in FIG. 14, the circuit can perform masking on a CA signal by using a CS masking signal, and can perform masking on a clock signal by using the CS masking signal, so that a current waste can be further avoided, thereby reducing power consumption.

Figure 15A:
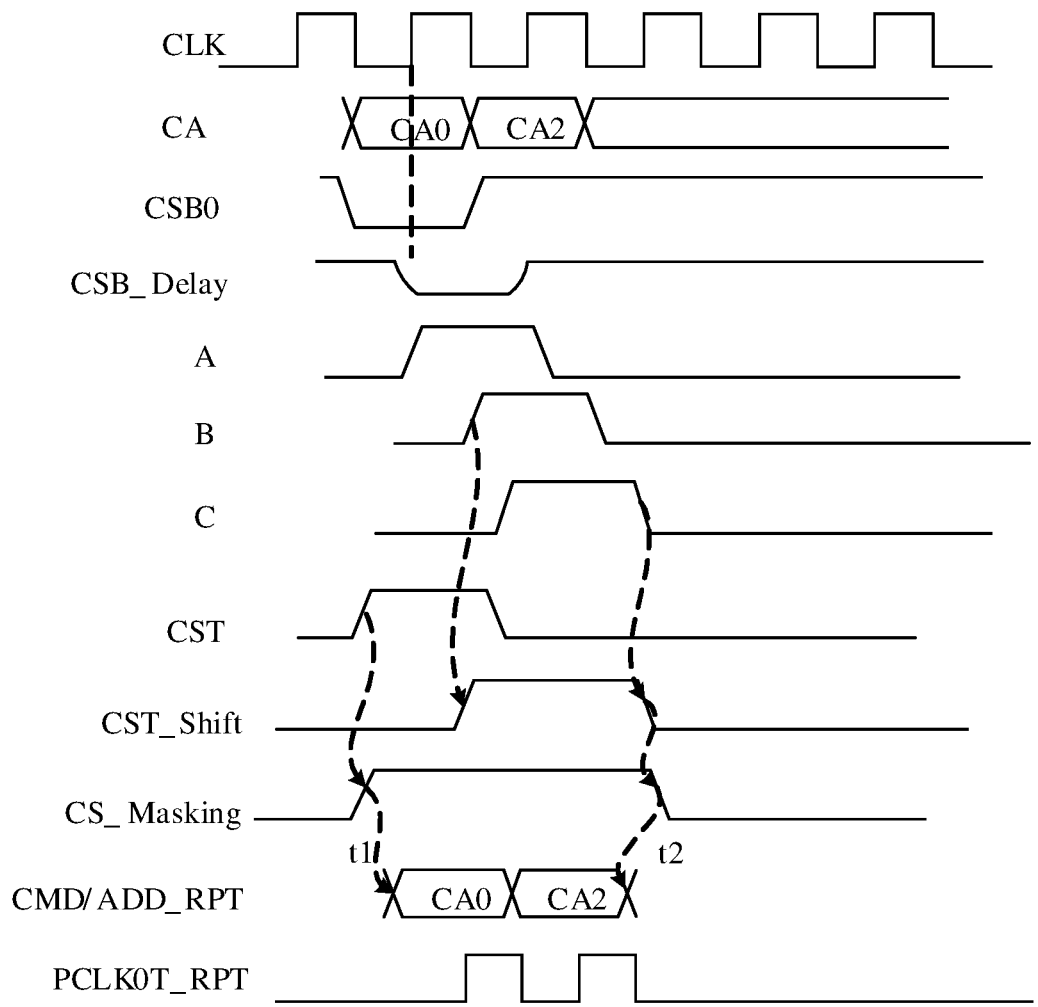
FIG. 15A is a fourth schematic timing diagram of signals of a signal masking circuit according to an embodiment of the disclosure.

FIG. 15A is a schematic timing diagram of signals of the signal masking circuit 70 illustrated in FIG. 14 when the CA signal is a valid signal. An initial CA signal outputted by the first receiver 1201 is denoted by CA, and valid parts of the initial CA signal include two preset clock periods (CA0 and CA2). An initial CS signal outputted by the second receiver 1202 is denoted by CSB0. The initial CS signal is an active-low pulse signal, and has a pulse width of one preset clock period. An initial clock signal outputted by the third receiver 1203 is denoted by CLK. After the CSB0 signal is inverted by the first inverter 1210, an obtained signal is denoted by CST and is an active-high pulse signal in this case. After the CSB0 signal passes through the first delay network formed by the first resistor R1 and the first capacitor C1, an obtained signal is denoted by CSB_Delay. As can be seen from FIG. 15A, there is a delay between CSB_Delay and CSB0. After the CSB_Delay signal is inverted by the second inverter 1211, an obtained signal is denoted by A. As can be seen from FIG. 15A, the A signal is an active-high pulse signal. The second inverter 1211 has the function of improving a signal driving capability, and thus the signal integrity of the A signal is significantly improved as compared with CSB_Delay. Further, after the A signal passes through the second delay network formed by the second resistor R2 and the second capacitor C2, an obtained signal is denoted by B. As can be seen from FIG. 15A, the B signal is still an active-high pulse signal, and there is a delay between the B signal and the A signal. Further, after the sixth buffer 1212 performs driving enhancement and delay processing on the B signal, an obtained signal is denoted by C. After the first OR gate 1213 performs an OR operation on the B signal and the C signal, pulse widths of the signals can be extended, and in such case, the obtained signal is denoted by CST_Shift. As can be seen from FIG. 15A, a pulse width of the CST_Shift signal is extended, a rising edge of the pulse is affected by a rising edge of the B signal, and a falling edge of the pulse is affected by a falling edge of the C signal. Further, after the second OR gate 1214 performs an OR operation on the CST signal and the CST_Shift signal, an obtained signal is denoted by CS_Masking. As can be seen from FIG. 15A, a pulse width of the CS_Masking has been extended to be greater than or equal to two preset clock periods, a rising edge of the pulse is affected by a rising edge of the CST signal, and a falling edge of the pulse is affected by a falling edge of the CST_Shift signal. In this way, after the first buffer 1204 performs driving enhancement and delay processing on the CA signal, the obtained first CA signal is denoted by CAL and during invalid masking on the CA1 signal by using the CS_Masking signal, CA0 and CA2 are both allowed to pass through within a time period during which the CS_Masking signal is at a high level. In this case, the obtained signal is the target CA signal, denoted by CMD/ADD_RPT. In addition, an initial clock signal outputted by the third receiver 1203 is denoted by CLK. After the tenth buffer 1301 performs driving enhancement and delay processing on the CLK signal, an obtained first clock signal is denoted by PCLK0T. In this way, during invalid masking on the PCLK0T signal by using the CS_Masking signal, valid parts are allowed to pass through within a time period during which the CS_Masking signal is at a high level. In this case, the obtained signal is the target clock signal, denoted by PCLK0T_RPT. Within another time period during which the CS_Masking signal is at a low level, the target clock signal is masked.

Figure 15B:
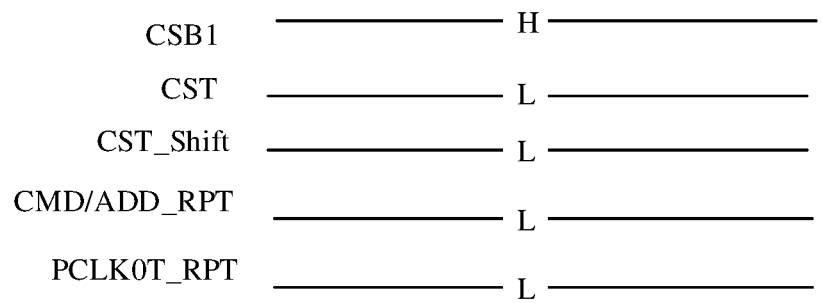
FIG. 15B is a fifth schematic timing diagram of signals of a signal masking circuit according to an embodiment of the disclosure.

FIG. 15B is a schematic timing diagram of signals of the signal masking circuit 70 illustrated in FIG. 14 when the CA signal is an invalid signal. As illustrated in FIG. 15B, an initial CS signal outputted by the second receiver 1202 is denoted by CSB1, and is a high-level signal (denoted by H). After the CSB1 signal is inverted by the first inverter 1210, the obtained CST signal is a low-level signal (denoted by L). After the CSB1 signal passes through the first resistor R1, the first capacitor C1, the second inverter 1211, the second resistor R2, the second capacitor C2, the sixth buffer 1212, and the first OR gate 1213, the obtained CST_Shift signal is still a low-level signal, resulting in that the CA signal is completely masked. That is, in such case, the obtained target CA signal (CMD/ADD_RPT) is a low-level signal (denoted by L), and the target clock signal (PCLK0T_RPT) is also a low-level signal (denoted by L).

It is to be noted that FIG. 15A represents a case that a chip is selected, and FIG. 15B represents a case that a chip is not selected. Therefore, CSB0 in FIG. 15A is an active-low pulse signal, and CSB1 in FIG. 15B is a high-level signal. CSB0 and CSB1 are respectively used for indicating that a chip is selected and that a chip is not selected.

That is, the CS signal is a signal representing whether a chip is selected. For a chip that is not selected, a CA signal/clock signal is an invalid signal, and the CS signal remains at a high level, resulting in that the CS masking signal remain at a low level, so that the CA signal/clock signal can be completely masked. For a chip that is selected, the CA signal/clock signal is a valid signal, the CS signal is an active-low pulse signal, resulting in that the CS masking signal is an active-high pulse signal and has the pulse width greater than or equal to two preset clock periods. In this way, for the CA signal, a valid part in the CA signal is allowed to pass through within a time period during which the CS masking signal is high, that is, the target CA signal is obtained. The CA signal only has two preset clock periods, and therefore there is no masking. For the clock signal, a valid part in the clock signal is allowed to pass through within a time period during which the CS masking signal is high, that is, the target clock signal is obtained. However, within other time periods of the CS masking signal, the clock signal is masked.

The embodiment provides a signal masking circuit. Specific implementations of the foregoing embodiments are described in detail through this embodiment. As can be seen, in the technical solutions of the foregoing embodiments, because a CA signal in a DDR5 DRAM is a signal based on two preset clock periods and a pulse width of a CS masking signal provided in the disclosure is greater than or equal to two preset clock periods, during masking of an initial processing signal, a current waste can be minimized to reduce power consumption while ensuring that the DDR5 DRAM does not lose valid information.

Figure 16:
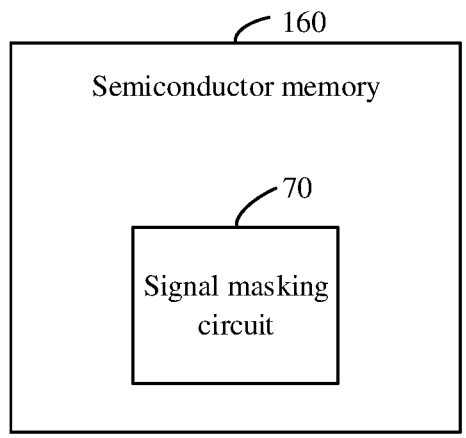
FIG. 16 is a schematic structural diagram of a semiconductor memory according to an embodiment of the disclosure.

In another embodiment of the disclosure, FIG. 16 is a schematic structural diagram of a semiconductor memory 160 according to an embodiment of the disclosure. As illustrated in FIG. 16, the semiconductor memory 160 may include any signal masking circuit 70 in the foregoing embodiments.

In the embodiments of the disclosure, the semiconductor memory 160 may be a DRAM chip.

Further, in some embodiments, the DRAM chip meets the DDR5 memory specification.

In the embodiments of the disclosure, a CS signal is used as a part for identifying CMD information in DDR5. However, the CS signal is an active-low pulse signal, and has a pulse width of one preset clock period. Because a CA signal in a DDR5 DRAM is a signal based on two preset clock periods, to avoid a CMD decoding failure due to the loss of CA information within the second clock period, the semiconductor memory 160 provided in the embodiment of the disclosure includes the signal masking circuit 70.

The signal masking circuit 70 may make a pulse width of the CS masking signal be greater than or equal to two preset clock periods, so that during masking of an initial processing signal, a current waste can be minimized to reduce power consumption while ensuring that the DDR5 DRAM does not lose valid information.

The foregoing is merely preferred embodiments of the disclosure but is not used to limit the scope of protection of the disclosure.

It is be noted that in the disclosure, terms "include" and "contain" or any other variation thereof is intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an" does not exclude existence of the same other elements in a process, method, object or device including the element.

The sequence numbers of the embodiments of the disclosure are adopted not to represent superiority-inferiority of the embodiments but only for description.

The methods disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

INDUSTRIAL APPLICABILITY

Embodiments of the disclosure provide a signal masking circuit and a semiconductor memory. The signal masking circuit includes a receiving circuit, a delay control circuit, and a logical operation circuit. The receiving circuit is configured to receive a signal to be processed and a CS signal, and output an initial processing signal and an initial CS signal. The delay control circuit is configured to perform delay and logical control operations on the initial CS signal to obtain a CS masking signal, and a pulse width of the CS masking signal is greater than or equal to two preset clock periods. The logical operation circuit is configured to perform invalid masking on the initial processing signal according to the CS masking signal to obtain a target signal. In this way, because a CA signal in a DDR5 DRAM is a signal based on two preset clock periods and a pulse width of the CS masking signal provided in the disclosure is greater than or equal to two preset clock periods, during masking of an initial processing signal, a current waste can be minimized to reduce power consumption while ensuring that the DDR5 DRAM does not lose valid information.

What is claimed is:

1. A signal masking circuit, comprising:
   a receiving circuit, configured to receive a signal to be processed and a chip select (CS) signal, and output an initial processing signal and an initial CS signal;
   a delay control circuit, configured to perform delay and logical control operations on the initial CS signal to obtain a CS masking signal, wherein a pulse width of the CS masking signal is greater than or equal to two preset clock periods; and
   a logical operation circuit, configured to perform invalid masking on the initial processing signal according to the CS masking signal to obtain a target signal;
   wherein the delay control circuit comprises:
   a first inverter, configured to invert the initial CS signal to obtain a first intermediate signal;
   a delay module, configured to delay the initial CS signal to obtain a second intermediate signal;
   a pulse width adjustment module, configured to perform pulse width extension on the second intermediate signal to obtain a third intermediate signal; and
   a first OR gate, connected to an output terminal of the first inverter and an output terminal of the pulse width adjustment module, and configured to perform an OR operation on the first intermediate signal and the third intermediate signal to obtain the CS masking signal; and
   wherein the delay module comprises a first delay unit, a second delay unit, and a second inverter, the second inverter is located between the first delay unit and the second delay unit, and each of the first delay unit and the second delay unit is formed by a resistor R and a capacitor C, wherein
   the first delay unit is configured to perform a first delay processing on the initial CS signal to obtain a first delay signal;

the second inverter is configured to invert the first delay signal to obtain an inverted delay signal; and the second delay unit is configured to perform a second delay processing on the inverted delay signal to obtain the second intermediate signal.

2. The signal masking circuit according to claim 1, wherein the CS signal is a signal indicating whether a chip is selected and is an active-low pulse signal, and a pulse width of the CS signal is one preset clock period.

3. The signal masking circuit according to claim 2, wherein the logical operation circuit is configured to mask, when the initial processing signal is a signal corresponding to a target chip, an invalid signal in the initial processing signal according to the CS masking signal, and/or mask, when the initial processing signal is a signal corresponding to a non-target chip, the initial processing signal completely according to the CS masking signal, wherein the target chip is a chip selected by the CS signal, and the non-target chip is a chip that is not selected by the CS signal.

4. The signal masking circuit according to claim 3, wherein the signal to be processed comprises at least one of a command/address (CA) signal or a clock signal, wherein a period of the clock signal is equal to the preset clock period.

5. The signal masking circuit according to claim 4, wherein when the signal to be processed is the CA signal, the receiving circuit comprises a first receiving module and a second receiving module, and the logical operation circuit comprises a first logical operation circuit, wherein the first receiving module is configured to receive the CA signal and output an initial CA signal;

the second receiving module is configured to receive the CS signal and output the initial CS signal;

the delay control circuit is connected to an output terminal of the second receiving module, and is configured to perform the delay and logical control operations on the initial CS signal to obtain the CS masking signal; and the first logical operation circuit is connected to an output terminal of the delay control circuit and an output terminal of the first receiving module, and is configured to perform a logical operation on the CS masking signal and the initial CA signal to obtain a target CA signal.

6. The signal masking circuit according to claim 4, wherein when the signal to be processed is the clock signal, the receiving circuit comprises a third receiving module and a fourth receiving module, and the logical operation circuit comprises a second logical operation circuit, wherein the third receiving module is configured to receive the clock signal and output an initial clock signal;

the fourth receiving module is configured to receive the CS signal and output the initial CS signal;

the delay control circuit is connected to an output terminal of the fourth receiving module, and is configured to perform the delay and logical control operations on the initial CS signal to obtain the CS masking signal; and the second logical operation circuit is connected to an output terminal of the delay control circuit and an output terminal of the third receiving module, and is configured to perform a logical operation on the CS masking signal and the initial clock signal to obtain a target clock signal.

7. The signal masking circuit according to claim 4, wherein when the signal to be processed is the CA signal and the clock signal, the receiving circuit comprises a first receiving module, a second receiving module, and a third receiving module, and the logical operation circuit comprises a first logical operation circuit and a second logical operation circuit, wherein the first receiving module is configured to receive the CA signal and output an initial CA signal;

the second receiving module is configured to receive the CS signal and output the initial CS signal;

the third receiving module is configured to receive the clock signal and output an initial clock signal;

the delay control circuit is connected to an output terminal of the second receiving module, and is configured to perform the delay and logical control operations on the initial CS signal to obtain the CS masking signal;

the first logical operation circuit is connected to an output terminal of the delay control circuit and an output terminal of the first receiving module, and is configured to perform invalid masking on the initial CA signal according to the CS masking signal to obtain a target CA signal; and the second logical operation circuit is connected to an output terminal of the delay control circuit and an output terminal of the third receiving module, and is configured to perform a logical operation on the CS masking signal and the initial clock signal to obtain a target clock signal.

8. The signal masking circuit according to claim 5, wherein the first logical operation circuit comprises a first buffer, a first AND gate, and a second buffer, wherein the first buffer is connected to the first receiving module, and is configured to perform driving enhancement and delay processing on the initial CA signal to obtain a first CA signal;

the first AND gate is connected to an output terminal of the first buffer and the output terminal of the delay control circuit, and is configured to perform an AND operation on the CS masking signal and the first CA signal to obtain a second CA signal; and the second buffer is connected to an output terminal of the first AND gate, and is configured to perform driving enhancement and delay processing on the second CA signal to obtain the target CA signal.

9. The signal masking circuit according to claim 6, wherein the second logical operation circuit comprises a third buffer, a second AND gate, and a fourth buffer, wherein the third buffer is connected to the third receiving module, and is configured to perform driving enhancement and delay processing on the initial clock signal to obtain a first clock signal;

the second AND gate is connected to an output terminal of the third buffer and the output terminal of the delay control circuit, and is configured to perform an AND operation on the CS masking signal and the first clock signal to obtain a second clock signal; and the fourth buffer is connected to an output terminal of the second AND gate, and is configured to perform driving enhancement and delay processing on the second clock signal to obtain the target clock signal.

10. The signal masking circuit according to claim 1, wherein the pulse width adjustment module comprises a fifth buffer and a second OR gate, wherein the fifth buffer is connected to an output terminal of the delay module, and is configured to perform driving enhancement and delay processing on the second intermediate signal to obtain a fourth intermediate signal; and the second OR gate is connected to the output terminal of the delay module and an output terminal of the fifth buffer, and is configured to perform an OR operation on the second intermediate signal and the fourth intermediate signal to obtain the third intermediate signal.

11. The signal masking circuit according to claim 7, further comprising: a buffer module formed by a plurality of sixth buffers, wherein
the buffer module is configured to perform driving enhancement and delay processing on the initial CS signal according to the plurality of sixth buffers to obtain a target CS signal.

12. The signal masking circuit according to claim 11, further comprising:
a sampling circuit, configured to receive the target CA signal, the target clock signal, and the target CS signal, and sample the target CA signal and the target CS signal by using the target clock signal to obtain a sampled CA signal and a sampled CS signal; and
a decoding circuit, connected to an output terminal of the sampling circuit and configured to decode the sampled CS signal and the sampled CA signal to obtain a target command result.

13. The signal masking circuit according to claim 12, wherein the sampling circuit is formed by a plurality of D flip-flops (DFFs).

14. The signal masking circuit according to claim 8, wherein the buffer is formed by two inverters.

15. The signal masking circuit according to claim 8, wherein a rising edge time of the CS masking signal is earlier than a pulse start time of the first CA signal, a falling edge time of the CS masking signal is later than a pulse end time of the first CA signal, and the CS masking signal and the first CA signal correspond to a same valid pulse of the CS signal.

16. A semiconductor memory, comprising a signal masking circuit, the signal masking circuit comprising:
a receiving circuit, configured to receive a signal to be processed and a chip select (CS) signal, and output an initial processing signal and an initial CS signal;
a delay control circuit, configured to perform delay and logical control operations on the initial CS signal to obtain a CS masking signal, wherein a pulse width of the CS masking signal is greater than or equal to two preset clock periods; and
a logical operation circuit, configured to perform invalid masking on the initial processing signal according to the CS masking signal to obtain a target signal;
wherein the delay control circuit comprises:
a first inverter, configured to invert the initial CS signal to obtain a first intermediate signal;
a delay module, configured to delay the initial CS signal to obtain a second intermediate signal;
a pulse width adjustment module, configured to perform pulse width extension on the second intermediate signal to obtain a third intermediate signal; and
a first OR gate, connected to an output terminal of the first inverter and an output terminal of the pulse width adjustment module, and configured to perform an OR operation on the first intermediate signal and the third intermediate signal to obtain the CS masking signal; and
wherein the delay module comprises a first delay unit, a second delay unit, and a second inverter, the second inverter is located between the first delay unit and the second delay unit, and each of the first delay unit and the second delay unit is formed by a resistor R and a capacitor C, wherein
the first delay unit is configured to perform a first delay processing on the initial CS signal to obtain a first delay signal;
the second inverter is configured to invert the first delay signal to obtain an inverted delay signal; and
the second delay unit is configured to perform a second delay processing on the inverted delay signal to obtain the second intermediate signal.

17. The semiconductor memory according to claim 16, wherein the semiconductor memory is a Dynamic Random Access Memory (DRAM) chip.

* * * * *